United States Patent [19]

Kokubo

[11] Patent Number: 5,706,231

[45] Date of Patent: Jan. 6, 1998

[54] SEMICONDUCTOR MEMORY DEVICE HAVING A REDUNDANT MEMORY CELL

[75] Inventor: Nobuyuki Kokubo, Hyogo, Japan

[73] Assignee: Mitsubishi Denki Kabushiki Kaisha, Tokyo, Japan

[21] Appl. No.: 768,088

[22] Filed: Dec. 16, 1996

[30] Foreign Application Priority Data

Jun. 27, 1996 [JP] Japan ................................. 8-167783

[51] Int. Cl.$^6$ ................................................ G11C 7/00
[52] U.S. Cl. ......................... 365/200; 365/202; 365/227
[58] Field of Search ................................ 365/200, 202, 365/227

[56] References Cited

FOREIGN PATENT DOCUMENTS

| | | |
|---|---|---|
| 58-1883 | 1/1983 | Japan . |
| 62-584887 | 3/1987 | Japan . |
| 62-243193 | 10/1987 | Japan . |
| 7-45093 | 2/1995 | Japan . |

*Primary Examiner*—David C. Nelms
*Assistant Examiner*—F. Niranjan
*Attorney, Agent, or Firm*—Lowe, Price, LeBlanc & Becker

[57] ABSTRACT

NMOS transistors are arranged between bit lines included in a memory cell array and a node supplied with a power supply potential. The NMOS transistor corresponding to a defective column to be replaced with a redundant memory cell column is turned of in a standby mode. In the standby mode, therefore, it is possible to reduce a current flowing from a power supply for a power supply potential to a word line at a ground potential through the NMOS transistor, the bit line and a short-circuited portion between the bit line and the word line.

8 Claims, 17 Drawing Sheets

SEMICONDUCTOR MEMORY DEVICE HAVING A REDUNDANT MEMORY CELL

BACKGROUND OF THE INVENTION

1. Field of the Invention

The present invention relates to a semiconductor memory device provided with a redundant circuit, and in particular to a semiconductor memory device which can reduce an unnecessary current flowing through a defective memory cell replaced with a redundant circuit.

2. Description of the Background Art

FIG. 22 is a schematic block diagram showing a whole structure of a conventional semiconductor memory device, and specifically a static random access memory (which will be referred to as an "SRAM" hereinafter).

Referring to FIG. 22, a conventional SRAM includes a row address input terminal group 3, a row address buffer 5, a row address decoder 7, a column address input terminal group 9, a column address buffer 11, a column address decoder group 13, memory cell arrays 15, redundant memory cell columns 17, multiplexers 19, sense amplifiers 21, an output data buffer 23, a data output terminal 25, a data input terminal 27, an input data buffer 29, a write data buffer 31, a /CAS input terminal 33, an RWC input terminal 35, a read/write control circuit 37, bit line load groups 201, redundant column program circuits 41, a block address input terminal group 43, a block address buffer 45 and a block selector circuit 47.

FIG. 23 is a schematic block diagram showing memory cell array 15 and its peripheral circuitry in the conventional SRAM in FIG. 22. Portions similar to those in FIG. 22 bear the same reference numbers, and will not be described below.

Referring to FIG. 23, memory cell array 15 includes memory cells 55a–55d which are arranged at crossings between bit line pairs BL and /BL and word lines WL. Redundant memory cell column 17 includes redundant memory cells 64a and 64b which are arranged at crossings between bit lines BL and /BL and word lines WL. Bit line load group 201 includes NMOS transistors 203 provided correspondingly to bit lines BL of memory cell array 15, respectively, NMOS transistors 205 provided correspondingly to bit lines /BL of memory cell array 15, respectively, an NMOS transistor 53 provided correspondingly to bit line BL of redundant memory cell column 17, and an NMOS transistor 54 provided correspondingly to bit line /BL of redundant memory cell column 17.

Multiplexer 19 includes NMOS transistors 57 provided correspondingly to bit lines BL of memory cell array 15, respectively, NMOS transistors 58 provided correspondingly to bit lines /BL of memory cell array 15, an NMOS transistor 56 provided correspondingly to bit line BL of redundant memory cell column 17, and an NMOS transistor 60 which is provided correspondingly to bit line /BL of redundant memory cell column 17. Column decoder 62 is connected to gates of NMOS transistors 57 and 58 via fuses 70. Gates of NMOS transistors 57 and 58 are connected to a node having a ground potential via resistance elements 68. Here, column decoder group 13 in FIG. 22 includes a plurality of column decoders, i.e., column decoders 62, which are provided correspondingly to memory cell arrays 15, respectively.

Referring to FIGS. 22 and 23, if bit lines BL and /BL are short-circuited to word line WL due to failure in a manufacturing process, the memory cells connected to these bit lines and word line become defective. A column corresponding to such a defective memory cell is call a defective column. Further, bit lines BL and /BL may be electrically connected to word line WL via a short-circuited portion in the memory cell. A column corresponding to this defective memory cell also becomes defective. In the SRAM provided with a redundant circuit (i.e., a circuit formed of redundant memory cell column 17, redundant column program circuit 41, fuse 70 and resistance element 68), an operation failure does not occur, because a plurality of defective memory cells was replaced with a plurality of redundant memory cells 64a and 64b. In the standby mode, all memory cells 55a–55d are unselected, and the word lines bear a ground potential. Therefore, a constant current continuously flows from a Vcc interconnection (i.e., node having a power supply potential) of the bit line to the word line at the ground potential through NMOS transistors (bit line load transistors) 203 and 205 and through a short-circuited portion in the defective memory cell. Thus, such a problem arises that an unnecessary current flows in the standby mode. Although this does not cause a substantial problem in the active mode of SRAM because a large operation current flows in this mode. In the standby mode, however, it is designed to flow no current other than a minute current flowing through load elements (not shown) of memory cells 55a–55d, so that a substantial problem arises.

SUMMARY OF THE INVENTION

The invention has been developed to overcome the above problem, and it is an object of the invention to provide a semiconductor memory device, which can reduce an unnecessary current flowing in the standby mode in the case where a defective memory cell is replaced with a redundant circuit.

A semiconductor memory device according to a first aspect of the invention has an active mode in which the device is set to the selected state by a chip select signal, and a standby mode in which the device is set to the unselected state by the chip select signal. This semiconductor memory device includes a plurality of memory cells, a plurality of bit line pairs, a plurality of word lines, a plurality of load elements, a load control circuit, and a redundant memory cell. The plurality of memory cells are arranged in a matrix form of rows and columns. The bit line pairs are arranged correspondingly to the columns, respectively. Each bit line pair is connected to the memory cells in the corresponding column. The word lines are arranged correspondingly to the rows. Each word line is connected to the memory cells in the corresponding row. Each load element is provided between each bit line of each bit line pair and a node having a first potential. The load element sets the potential on the corresponding bit line to a predetermined potential when it has a first impedance. The load control circuit sets, in the active mode, the impedance of the load element to the first impedance, and sets, in the standby mode, the impedance of the load element to a second impedance larger than the first impedance. The redundant memory cell is provided for replacing the memory cell corresponding to the defective column. This semiconductor memory device further includes a circuit for replacing the memory cell corresponding to the defective column with the redundant memory cell, when a column address signal applied to the device selects the defective column. In this semiconductor memory device, all the word lines are unselected in the standby mode.

In the semiconductor memory device according to the first aspect of the invention, the load control circuit sets the impedance of the load element in the standby mode to exceed that in the active mode. Therefore, when the memory cell is replaced with the redundant memory cell, it is possible, in the standby mode, to eliminate a current which flows from the node having the first potential to the ground through the defective column corresponding to the same memory cell.

Preferably, the semiconductor memory device according to the first aspect of the invention further includes a selection control circuit for preventing setting of any one of the word line, to the selected state until the potential on each bit line reaches a proximity of a predetermined potential after change from the standby mode to the active mode. Therefore, it is possible to prevent erroneous writing of data into the memory cell immediately after switching from the standby mode to the active mode.

A semiconductor memory device according to a second aspect of the invention includes a plurality of memory cells, a plurality of bit line pairs, a plurality of load elements, a redundant memory cell and a load control circuit. The plurality of memory cells are arranged in a matrix form of rows and columns. The bit line pairs are arranged correspondingly to the columns. Each bit line pair is connected to the memory cells in the corresponding column. Each load element is provided between each bit line of each bit line pair and a node having a first potential for setting a potential on the corresponding bit line to a predetermined potential. The redundant memory cell is provided for replacing the memory cell corresponding to the defective column. The load control circuit sets an impedance of the load element corresponding to the bit line connected to the memory cell replaced with the redundant memory cell to exceed an impedance of the load element corresponding to another bit line.

In the semiconductor memory device according to the second aspect of the invention, the impedance of the load element corresponding to the bit line connected to the memory cell, which is replaced with the redundant memory cell, is set to exceed the impedance of the load element corresponding to another bit line. Therefore, it is possible to eliminate a current flowing from the node having the first potential to the ground through the defective column corresponding to the memory cell replaced with the redundant memory cell.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An SRAM which is a semiconductor memory device according to the invention will be described below with reference to drawings.

(Embodiment 1)

Figure 1:
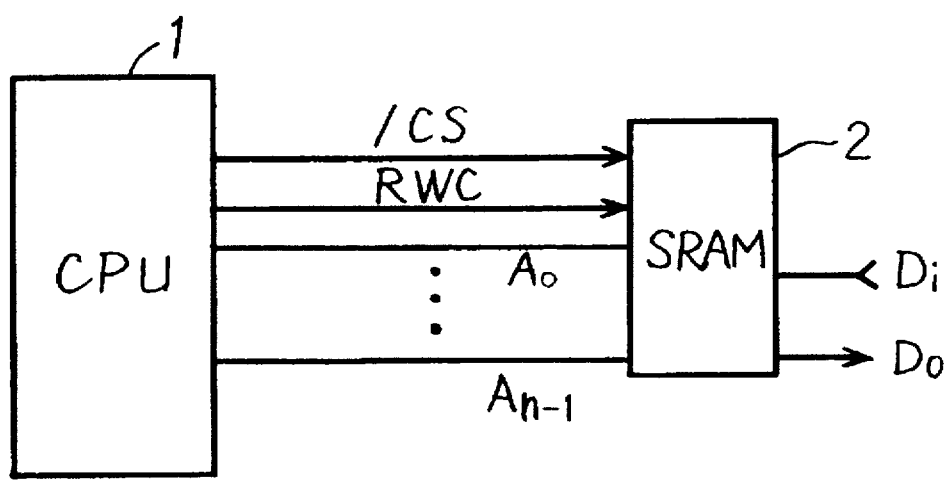
FIG. 1 is a schematic block diagram showing a CPU as well as an SRAM of an embodiment 1 of the invention.

FIG. 1 is a schematic block diagram showing a central processing unit (which will be referred to as a "CPU" hereinafter) and an SRAM according to an embodiment 1 of the invention. Referring to FIG. 1, an SRAM 2 receives a chip select signal /CS, a read/write control signal RWC and address signals $A_0$-$A_{n-1}$ from a CPU 1. SRAM 2 can store externally applied data Di, and can externally issue stored data Do. Here, SRAM 2 goes into a standby mode when it receives chip select signal/CS at H(high)-level, and goes into an active mode when it receives chip select signal/CS at L(low)-level. Thus, the state where it is selected by chip select signal /CS is the active mode, and the state where it is unselected by the same is the standby mode.

Figure 2:
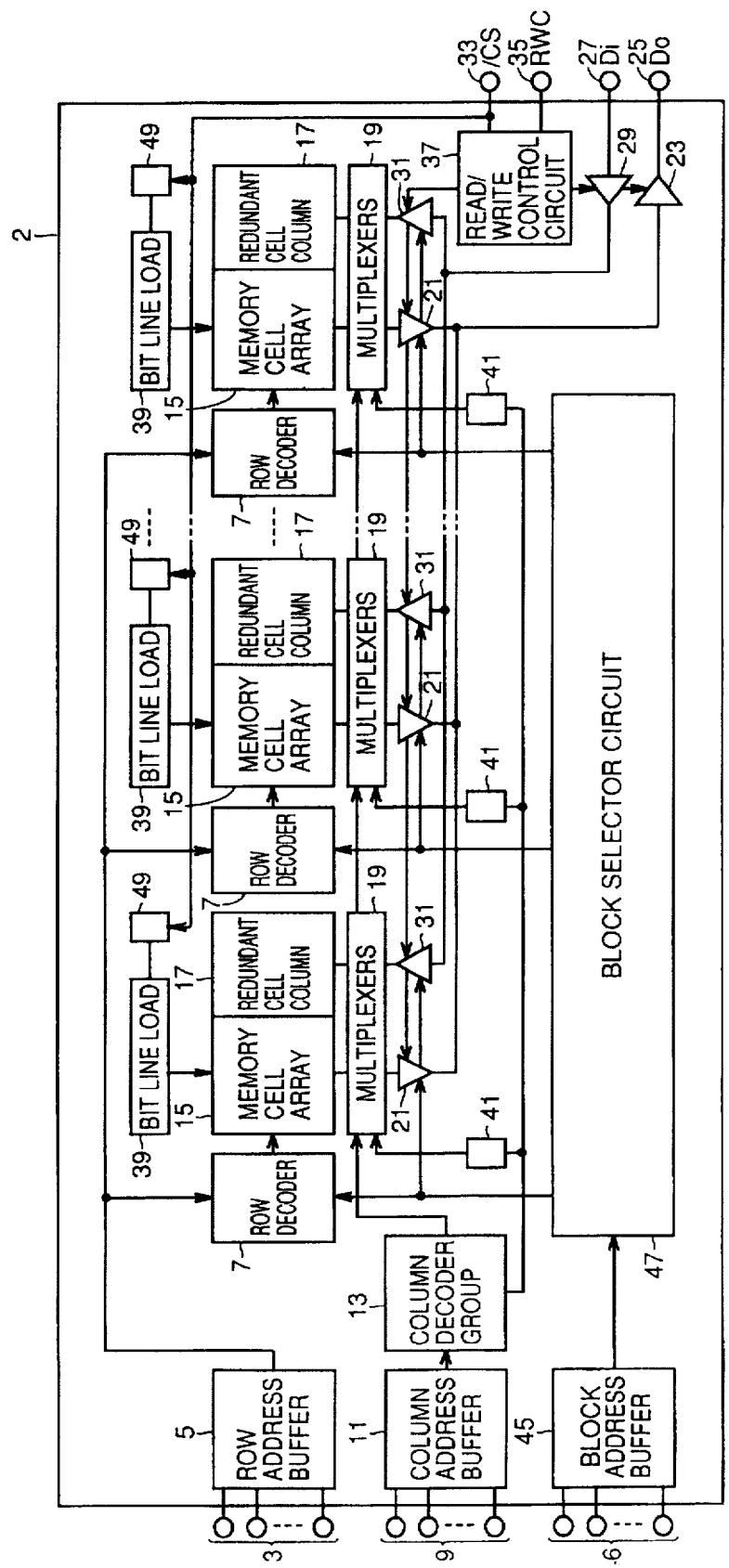
FIG. 2 is a schematic block diagram showing a whole structure of the SRAM of the embodiment 1 shown in FIG. 1.
Figure 22:
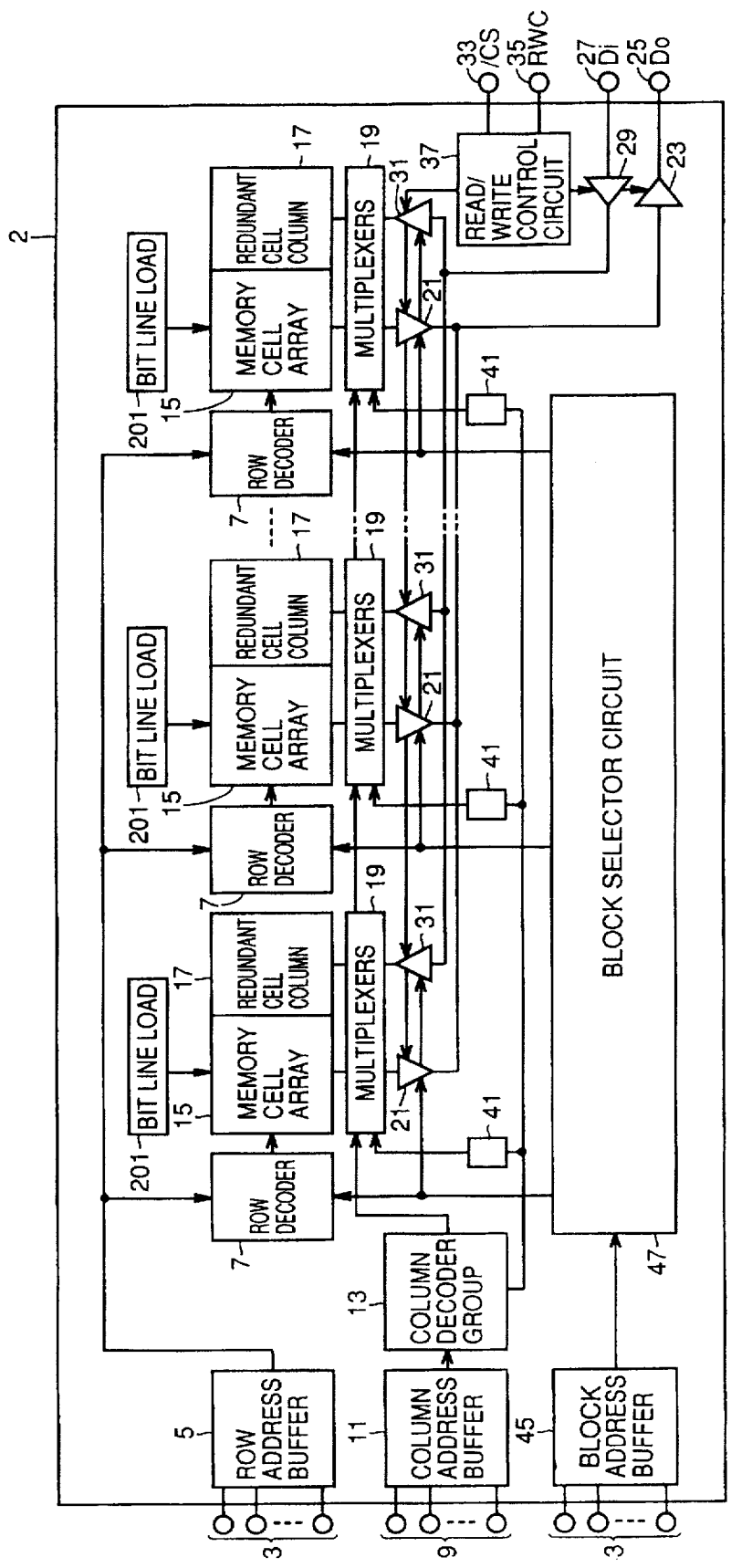
FIG. 22 is a schematic block diagram showing a whole structure of a conventional SRAM.

FIG. 2 is a schematic block diagram showing SRAM 2 in FIG. 1. Portions similar to those in FIG. 1 bear the same reference numbers, and will not be described below. Further, portions similar to those in FIG. 22 bear the same reference numbers. Referring to FIG. 2, SRAM 2 of the embodiment 1 of the invention includes a row address input terminal group 3, a row address buffer 5, a row address decoder 7, a column address input terminal group 9, a column address buffer 11, a column address decoder group 13, memory cell arrays 15, redundant memory cell columns 17, multiplexers 19, sense amplifiers 21, an output data buffer 23, a data output terminal 25, a data input terminal 27, an input data buffer 29, a write data buffer 31, a /CS input terminal 33, an RWC input terminal 35, a read/write control circuit 37, bit line load groups 39, redundant column block circuits 41, a block address input terminal group 43, a block address buffer 45, a block selector circuit 47 and a load control circuit 49.

Referring to FIGS. 1 and 2, row address input terminal group 3 receives a row address signal among address signals $A_0$-$A_{n-1}$. Row address buffer 5 is provided for amplifying or inverting the row address signal. Row address decoder 7 is provided for decoding the row address signal applied to row address input terminal group 3. Column address input terminal group 9 receives a column address signal among address signals $A_0$-$A_{n-1}$. Column address buffer 11 is provided for amplifying or inverting the column address signal. Column address decoder group 13 includes a plurality of column address decoders (not shown) provided correspondingly to memory cell arrays 15, respectively. Column address decoder group 13 includes a plurality of column address decoders (not shown) provided correspondingly to memory cell arrays 15, respectively. The column address decoder is provided for decoding the column address signal applied to the column address input terminal group 9. Memory cell array 15 includes memory cells (not shown) storing information, which are arranged in a matrix form. Sense amplifier 21 is provided for sensing and amplifying a read voltage of a small amplitude. Output data buffer 23 is provided for amplifying the output of sense amplifier 21 to a level suitable to external output from SRAM 2. Read data Do is issued from data output terminal 25. Write data Di is input through data input terminal 27. Input data buffer 29 is provided for amplifying a signal (write data Di) applied through data input terminal 27. Write data buffer 31 is provided for converting data Di amplified by input buffer 29 into data to be written into the memory cell.

/CS input terminal is supplied with chip select signal /CS from CPU 1. Read/write control signal RWC is applied to RWC input terminal 35 from CPU 1. Read/write control circuit 37 is provided for controlling sense amplifiers 21, output data buffer 23, write data buffer 31 and others in accordance with selection/unselection of chip and data read/write modes. Bit line load group 39 is provided for setting bit lines (not shown) of memory cell array 15 and redundant memory cell column 17 to a predetermined potential. More specifically, bit line load group 39 precharges the bit lines. Block address input terminal group 43 receives a block address signal among address signals $A_0$-$A_{n-1}$ from CPU 1. Block address buffer 45 is provided for amplifying and inverting the block address signal. Block selector circuit 47 selects the block in accordance with the block address signal. Here, load control circuit 49, bit line load group 39, memory cell arrays 15, redundant memory cell columns 17, row address decoder 7, multiplexers 19, sense amplifiers 21, write data buffers 31, redundant column program circuit 41 and column decoders included in column decoder group 13 form one block. Load control circuit 49, bit line load group 39, memory cell arrays 15, redundant memory cell columns 17, multiplexers 19 and redundant column program circuits 41 will be described below more in detail.

Figure 3:
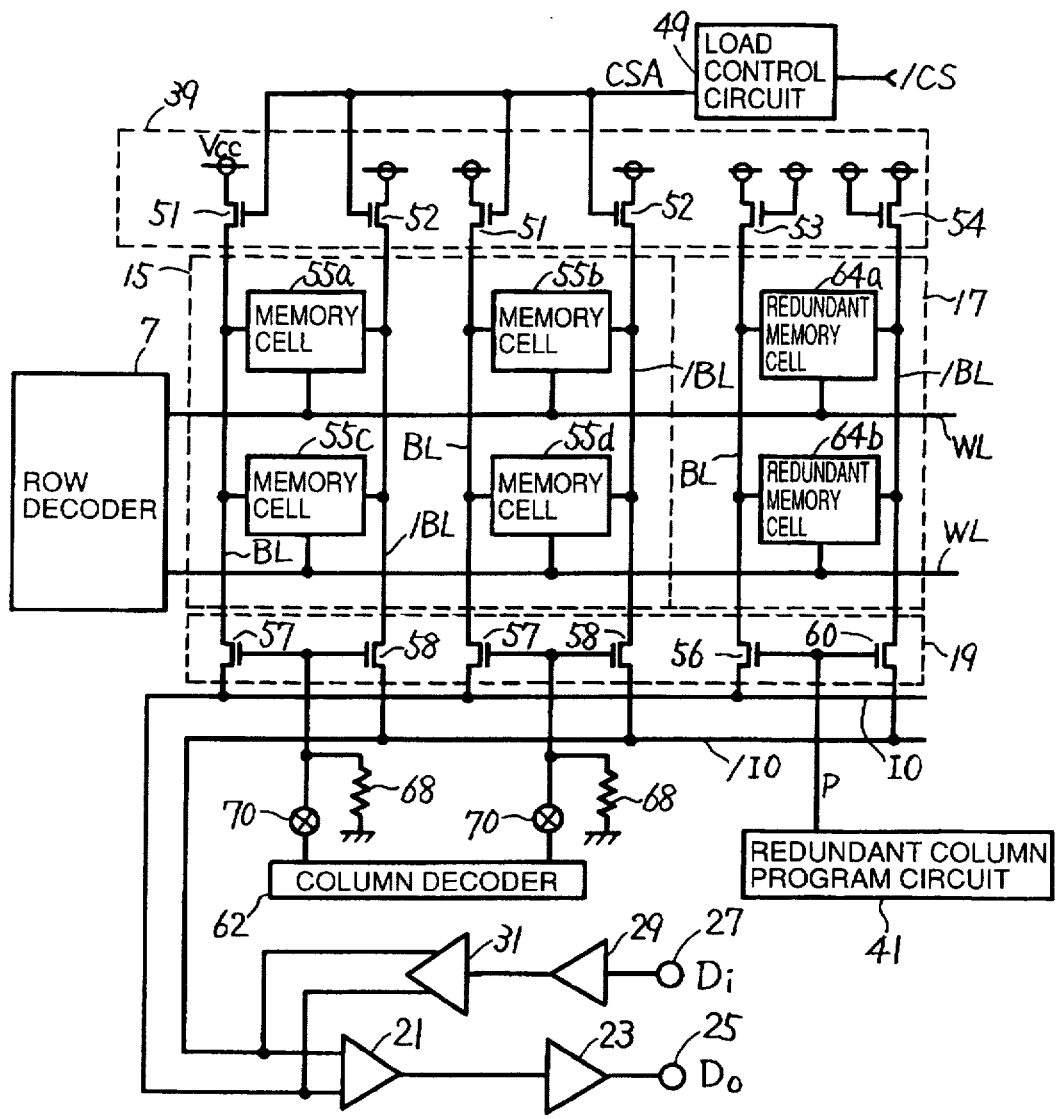
FIG. 3 is a schematic block diagram showing a memory cell array and its peripheral circuitry in the SRAM of the embodiment 1.
Figure 23:
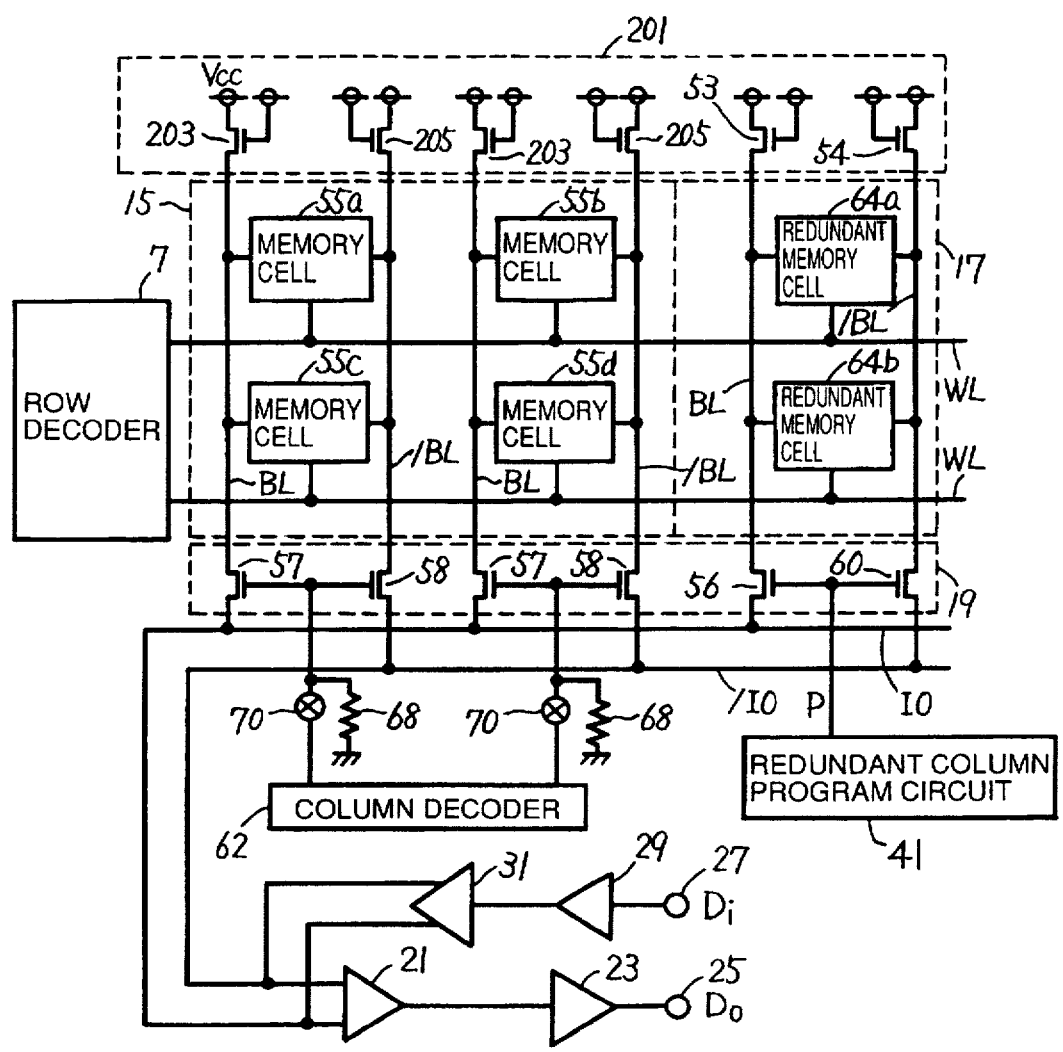
FIG. 23 is a schematic block diagram showing a memory cell array and its peripheral circuitry in the conventional SRAM.

FIG. 3 is a schematic block diagram showing memory cell array 15 and its peripheral circuitry in SRAM 2 in FIG. 2. Potions similar to those in FIG. 2 bear the same reference numbers, and will not be described below. Also, portions similar to those in FIG. 23 bear the same reference numbers. Referring to FIG. 3, memory cell array 15 includes memory cells 55a-55d arranged at crossings between bit lines BL and /BL and word lines WL. Redundant memory cell column 17 includes redundant memory cells 64a and 64b arranged at crossings between bit lines BL and /BL and word lines WL. Although FIG. 3 shows the memory cell array of the structure including two rows and two columns for simplicity reasons, the memory cell array may have a structure including three or more rows and three or more columns. In this case, more redundant memory cells are employed in accordance with the number of memory cells connected to one bit line pair BL and /BL.

Bit line load group 39 includes NMOS transistors 51 which are arranged between bit lines BL of memory cell array 15 and nodes having a power supply potential Vcc, respectively, NMOS transistors 52 which are arranged between bit lines /BL of memory cell array 15 and nodes having power supply potential Vcc, respectively, an NMOS transistor 53 which is arranged between bit line BL of redundant memory cell column 17 and a node having power supply potential Vcc, and an NMOS transistor 54 which is arranged between bit line /BL of redundant memory cell column 17 and a node having power supply potential Vcc. Gates of NMOS transistors 51 and 52 receive a load control signal CSA from load control circuit 49. Load control signal CSA is produced from chip select signal /CS.

Multiplexer 19 includes an NMOS transistor 57 which is arranged between bit line BL of memory cell array 15 and I/O line IO, an NMOS transistor 58 which is arranged between bit line /BL of memory cell array 15 and I/O line /IO, an NMOS transistor 56 which is arranged between bit line BL of redundant memory cell column 17 and I/O line I/O, and an NMOS transistor 60 which is arranged between bit line/BL of redundant memory cell column 17 and I/O line /IO. Column address decoder 62 is connected to gates of NMOS transistors 57 and 58 through fuses 70. Gates of NMOS transistors 57 and 58 are connected to nodes having the ground potential via resistance elements 68. Gates of NMOS transistors 56 and 60 are supplied with a signal P from redundant column program circuit 41. Row address decoder 7 is connected to word line WL. Sense amplifier 21 is connected to I/O line pair IO and /IO for sensing and amplifying a potential difference of I/O line pair IO and /IO. An output node of sense amplifier 21 is connected to an input node of output data buffer 23. Output data buffer 23 amplifies an output of sense amplifier 21, and issues it from data output terminal 25 as data Do. An input node of input data buffer 29 is connected to data input terminal 27. An output node of input data buffer 29 is connected to an input node of write data buffer 31. An output node of write data buffer 31 is connected to I/O line pair IO and /IO. Column address decoder 62 is included in column address decoder group 13.

Figure 4:
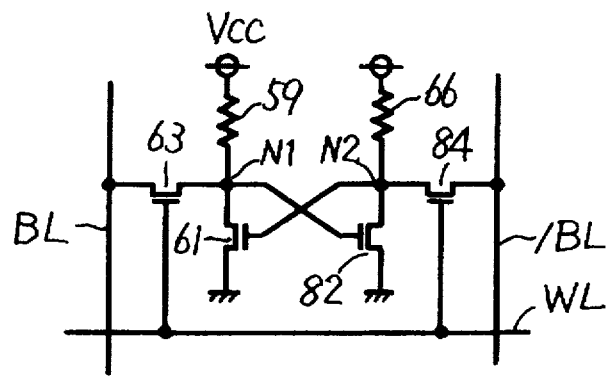
FIG. 4 is a circuit diagram specifically showing a memory cell of a high resistance load type which is an example of the memory cell in FIG. 3.

FIG. 4 is a circuit diagram specifically showing a memory cell of a high resistance load type which is an example of memory cells 55a-55d in FIG. 3. Referring to FIG. 4, the memory cell of the high resistance load type includes resistance elements 59 and 66, access transistors 63 and 84, and driver transistors 61 and 82. Resistance element 59 is connected between a node having power supply potential Vcc and a storage node N1. Resistance element 66 is connected between a node having power supply potential Vcc and a storage node N2. Driver transistor 61 is connected between storage node N1 and a node having the ground potential. A gate of driver transistor 61 is connected to storage node N2. Driver transistor 82 is connected between storage node N2 and a node having the ground potential. A gate of driver transistor 82 is connected to storage node N1. Access transistor 63 is connected between bit line BL and storage node N1. A gate of access transistor 63 is connected to word line WL. Access transistor 84 is connected between bit line /BL and storage node N2. A gate of access transistor 84 is connected to word line WL. Here, resistance elements 59 and 66 have a high resistance. Driver transistors 61 and 82 and access transistors 63 and 84 are NMOS transistors. Redundant memory cells 64a and 64b in FIG. 3 may be formed of the memory cells of the high resistance load type in FIG. 4.

Figure 5:
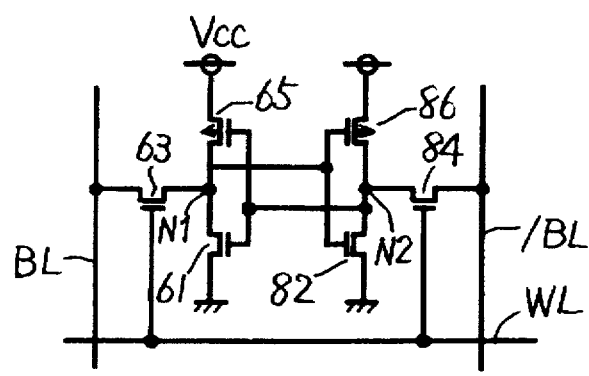
FIG. 5 is a circuit diagram specifically showing a memory cell of a CMOS type which is another example of the memory cell in FIG. 3.

FIG. 5 is a circuit diagram specifically showing a CMOS memory cell which is another example of memory cells 55a–55d in FIG. 3. Portions similar to those in FIG. 4 bear the same reference numbers, and will not be described below. Referring to FIG. 5, the CMOS memory cell includes PMOS transistors 65 and 86, driver transistors 61 and 82, and access transistors 63 and 84. PMOS transistor 65 is connected between a node having power supply potential Vcc and storage node N1. A gate of PMOS transistor 65 is connected to storage node N2. PMOS transistor 86 is connected between a node having power supply potential Vcc and storage node N2. A gate of PMOS transistor 86 is connected to storage node N1. Redundant memory cells 64a and 64b in FIG. 3 may be formed of the CMOS memory cells in FIG. 5.

An operation of the SRAM in the active mode will be briefly described below. Here, the active mode is the state where the SRAM is selected by chip select signal /CS. Referring to FIG. 3, a load control signal CSA is at H-level when the operation is in the active mode. Therefore, NMOS transistors 51 and 52 are on. Accordingly, the potentials on bit lines BL and /BL of memory cell array 15 go to (Vcc-Vth) where Vth is a threshold voltage of NMOS transistors 51, 52, 53 and 54. The potentials on bit lines BL and /BL of redundant memory cell column 17 also go to Vcc-Vth. For convenience sake, it is assumed that redundant memory cell column 17 is not used, and fuses 70 are not blown. Row address decoder 7 selects one word line WL in accordance with the row address signal, and sets the selected word line WL to H-level. Column address decoder 62 selects one column in accordance with the column address signal, and applies a signal at H-level to gates of NMOS transistors 57 and 58 corresponding to the selected column.

Figure 6:
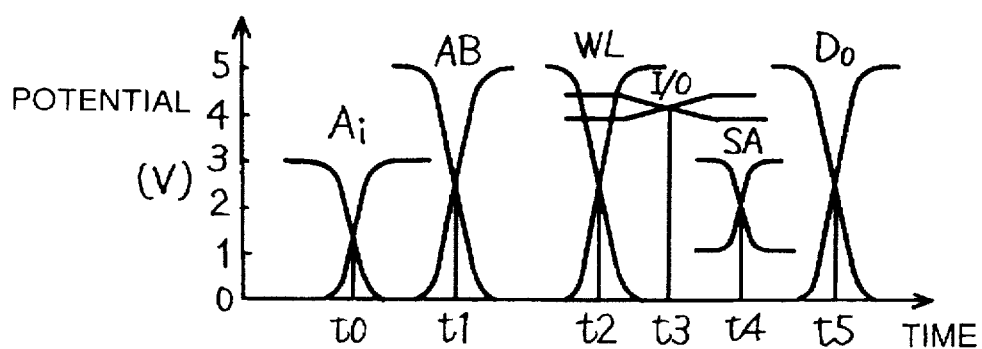
FIG. 6 shows operation timings of the SRAM of the embodiment 1.

FIG. 6 shows operation timings of the SRAM of the embodiment 1. Also with reference to FIGS. 1 to 3, FIG. 6 shows address signals Ai (A₀-A$_{n-1}$) applied from CPU 1 to SRAM 2 near time t0, outputs AB from address buffers 5, 11 and 45 near time t1, potential WL on word line WL near time t2, potentials I/O on I/O lines IO and /IO near time t3, output SA from sense amplifier 21 near time t4, and data Do externally issued near time t5. FIG. 6 shows timings in the read operation.

Referring to FIGS. 2 and 3, when memory cell 55a is to be selected, the row address signal corresponding to the row, in which memory cell 55a to be selected is present, is supplied via row address input terminal group 3. Row address decoder 7 sets word line WL, which is connected to memory cell 55a to be selected, to the select level (e.g., at H-level), and sets other word lines WL to the unselected level (e.g., L-level). In this manner, a row corresponding to the memory cell 55a to be selected is selected. Selection of the column will be described below. A column address signal corresponding to the column, in which bit line pair BL and /BL connected to memory cell 55a to be selected is present, is supplied via column address input terminal group 9. The column address decoder 62 applies a signal at H-level to gates of NMOS transistors 57 and 58 corresponding to bit line pair BL and /BL connected to memory cell 55a to be selected. Thereby, only NMOS transistors 57 and 58 corresponding to bit line pair BL and /BL, which is connected to memory cell 55a to be selected, are turned on, and bit line pair BL and /BL connected to memory cell 55a to be selected is connected to I/O line pair IO and /IO. NMOS transistors 57 and 58 corresponding to other bit line pairs BL and /BL are supplied with signals at L-level, and NMOS transistors 57 and 58 corresponding to the other bit lines BL and /BL are turned off. Therefore, other bit line pairs BL and /BL are isolated from I/O lines IO and /IO. In this manner, the column is selected. Other memory cells 55b–55d can be selected in a similar manner.

Referring to FIGS. 3 and 4, an operation for reading from selected memory cell 55a will be described below. It is assumed that Storage node N1 of selected memory cell 55a is at H-level, and storage node N2 is at L-level. In this case, one of driver transistors 61 in memory cell 55a is off, and the other driver transistor 82 is on. Word line WL connected to memory cell 55a is at L-level and thus is selected, so that both access transistors 63 and 84 of memory cell 55a are on. Therefore, a DC current flows through a path from the power supply for power supply potential Vcc through NMOS transistor 52, bit line /BL, access transistor 84, and driver transistor 82 to the ground. However, a DC current does not flow through a path from the power supply for power supply potential Vcc through NMOS transistor 51, bit line BL, access transistor 63 and driver transistor 61 to the ground, because the driver transistor 61 is off.

In this case, the potential on bit line BL through which a DC current does not flow goes to (Vcc-Vth), where Vcc is the power supply potential and Vth is a threshold voltage of NMOS transistors (bit line load transistors) 51, 52, 53 and 54. The potential on bit line /BL through which a DC current flows goes to (Vcc-Vth-ΔV). This is because that the potential on bit line /BL, through which the DC current flows, is resistance-divided by continuity resistances of driver and access transistors 82 and 84 and a continuity resistance of NMOS transistor 52, and therefore lowers ΔV from (Vcc-Vth). Here, ΔV, which is called a bit line amplitude, is generally in a range from about 50 mV to about 500 mV, and is adjusted by sizes of NMOS transistors (bit line load transistors) 51, 52, 53 and 54. Bit line amplitude ΔV appears on I/O lines IO and /IO via NMOS transistors (transfer gates) 57 and 58. Bit line width ΔV appearing on I/O lines IO and/IO is amplified by sense amplifier 21, and further is amplified by output data buffer 25 for forming output data Do to be read out. In the read operation, input data buffer 29 is controlled by read/write control circuit 37 (FIG. 2) not to drive I/O line pair IO and /IO.

The write operation will be described below. A potential on bit line at the side for writing low data is forcedly lowered to a low potential, and the potential on the other bit line is maintained at (Vcc-Vth), whereby the writing is performed. Description will be given on such a case that inverted data is written into memory cell 55a, when the storage node N1 of memory cell 55a is at H-level and storage node N2 thereof is at L-level. In this case, write data buffer 31 sets one of I/O lines IO to L-level, and maintains the other I/O line /IO at (Vcc-Vth). One of bit lines BL is set to L-level, and the other bit line /BL is maintained at (Vcc-Vth), whereby the writing is performed.

Generally, in SRAMs including the SRAM having the above structure, all word lines WL are at L-level in the standby mode, and an operation current, which flows in the active mode, does not flow in any one of the memory cells in the standby. Only a load current of the memory cells, which is required for maintaining the storage data of memory cells, flows in the standby. In the SRAM employing the memory cells of the high resistance load type shown in FIG. 4, a current which equal to a product of a current flowing through resistance element 59 or 66 and a total number of memory cells flows in the standby mode. Generally, in SRAMs including the SRAM having the above structure, resistance elements 59 and 66 of a high resistance value (e.g., 10 teraohms per element) are used for the purpose of reducing this standby current, and thus the standby current can be actually reduced. Further, in the SRAM employing the CMOS memory cell in FIG. 5, only a cut-off current of PMOS transistor 65 or 86 flows in the standby mode, so that the standby current can be further reduced compared with the SRAM employing the memory cell of the high resistance load type.

Figure 7:
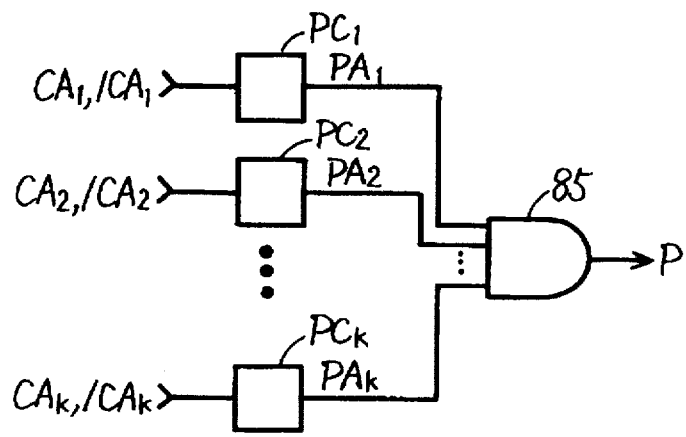
FIG. 7 is a schematic block diagram showing redundant column program circuits in FIG. 3.

FIG. 7 is a schematic block diagram showing redundant column program circuit 41 in FIG. 3. Referring to FIG. 7, the redundant column program circuit includes program circuits $PC_1$-$PC_K$ and an AND circuit 85. Program circuits $PC_1$-$PC_k$ receive corresponding column address signals $CA_1$-$CA_k$ among address signals $A_0$-$A_{n-1}$. Further, program circuits $PC_1$-$PC_k$ receive inverted signals /$CA_1$-/$CA_k$ among corresponding column address signals $CA_1$-$CA_k$. Output signals $PA_1$-$PA_k$ of program circuits $PC_1$-$PC_k$ form inputs of AND circuit 85. An output node of AND circuit 85 is connected to gates of NMOS transistors 56 and 60 in FIG. 3. Thus, an output signal P of AND circuit 85 is sent to gates of NMOS transistors 56 and 60 in FIG. 3. The number of program circuits $PC_1$-$PC_k$ depends on the number of columns in memory cell array.

Figure 8:
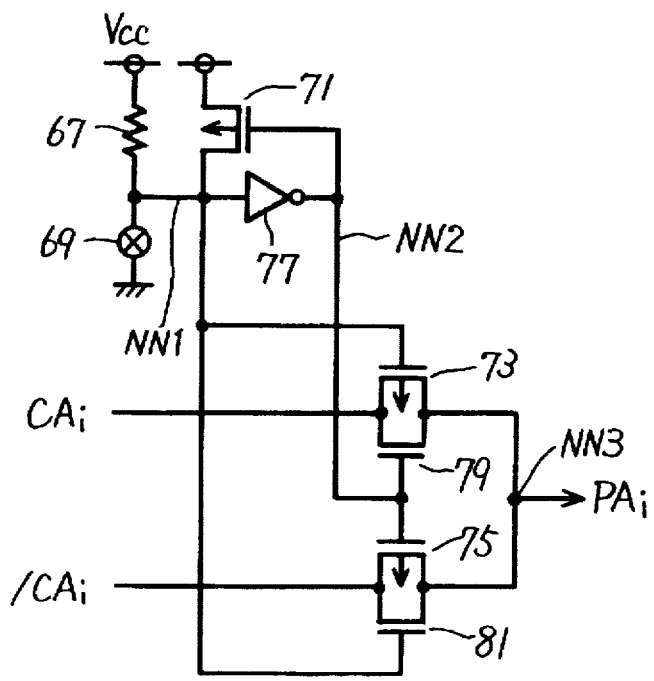
FIG. 8 is a circuit diagram specifically showing one of program circuits $PC_1$-$PC_k$ in FIG. 7.

FIG. 8 is a circuit diagram specifically showing one of program circuits $PC_1$-$PC_k$ in FIG. 7. Referring to FIG. 8, the program circuit includes a resistance element 67, a fuse 69, PMOS transistors 71, 73 and 75, NMOS transistors 79 and 81, and an inverter 77. The resistance element 67 is connected between a node having power supply potential Vcc and a node NN1. Fuse 69 is connected between node NN1 and a node having the ground potential. Inverter 77 is connected between nodes NN1 and NN2. PMOS transistor 71 is connected between a node having power supply potential Vcc and node NN1. A gate of PMOS transistor 71 is connected to node NN2. Each of PMOS and NMOS transistors 73 and 79 receives column address signal $CA_i$ on one of its source/drain, and is connected at the other of source/drain to node NN3. Gates of PMOS and NMOS transistors 73 and 81 are connected to node NN1. Gates of NMOS and PMOS transistors 79 and 75 are connected to node NN2. A node NN3 forms an output node of this program circuit, and signal $PA_i$ is issued therefrom. Column address signal $CA_i$ represents one of column address signals $CA_1$-$CA_k$, signal /$CA_i$ represents one of signals /$CA_1$-$CA_k$, and signal $PA_i$ represents one of signals $PA_1$-$PA_k$.

Referring to FIGS. 3, 7 and 8, description will be given on an operation of replacing a defective memory cell with a redundant memory cell. It is assumed that memory cells 55a and 55c are defective due to short-circuit of word line WL to bit lines BL and /BL connected to memory cells 55a and 55c, and therefore memory cells 55a and 55c are to be replaced with redundant memory cells 64a and 64b. In this case, fuses 70 corresponding to memory cells 55a and 55c are blown off. Thereby, the potentials applied to gates of NMOS transistors 57 and 58 corresponding to memory cells 55a and 55c are fixed at L-level. Thus, a defective column is deactivated. Therefore, bit lines BL and /BL in the defective column are not connected to I/O lines IO and /IO, even if the column address signal for selecting the defective column is supplied.

Although memory cell array 15 in FIG. 3 includes only two columns, it is now assumed that memory cell array 15 includes three of more columns in the following description. Also, it is assumed that the column having memory cells 55a and 55c is selected, when all column address signals $CA_1$-$CA_k$ are at H-level. Thus, the defective column is replaced with redundant memory cell column 17, when all column address signals $CA_1$-$CA_k$ are at H-level. In this case, any of fuses 69 of program circuits $PC_1$-$PC_k$ is not blown. Thereby, all of PMOS and NMOS transistors 73 and 79 in program circuits $PC_1$-$PC_k$ are on, and all of PMOS and NMOS transistors 75 and 81 are off. Therefore, signal $PA_i$ attains H-level, when column address signal $CA_i$ at H-level is supplied. Therefore, all signals $PA_1$-$PA_k$ attain H-level, when all column address signals $CA_1$-$CA_k$ attain H-level. When all signals $PA_1$-$PA_k$ are at H-level, signal P attains H-level. Signal P at H-level turns on NMOS transistors 56 and 60, and bit lines BL and /BL of redundant memory cell column 17 are connected to I/O lines IO and /IO, respectively.

As described above, fuses 70 corresponding to the defective column having memory cells 55a and 55c are blown, and bit lines BL and /BL in the defective column are isolated from I/O lines IO and /IO. Further, when the column address signal selecting the defective column is applied, redundant column program circuit 41 applies signal P at H-level to NMOS transistors 56 and 60 to connect bit lines BL and /BL in the redundant memory cell column 17 to I/O lines IO and /IO. Description has been given on the case where redundant memory cell column 17 is selected when all column address signals $CA_1$-$CA_k$ are at H-level, conditions of the column address signals which select redundant memory cell column 17 can be arbitrarily set by adjusting connection/disconnection of fuses 69 of program circuits $PC_1$-$PC_k$.

Figure 9:
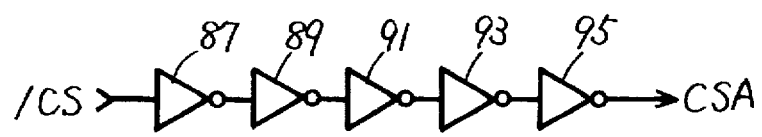
FIG. 9 is a circuit diagram specifically showing a load control circuit in FIG. 3.

FIG. 9 is a circuit diagram specifically showing load control circuit 49 in FIG. 3. Referring to FIG. 9, the load control circuit includes inverters 87, 89, 91, 93 and 95 connected in series. Inverter 87 is supplied with chip select signal /CS. Inverter 95 issues load control signal CSA. Referring to FIGS. 3 and 9, when the SRAM is in the standby mode, load control circuit 49 applies load control signal CSA at L-level to gates of NMOS transistors 51 and 52. This is because that, in the standby mode, chip select signal /CS is at H-level. Owing to the above, it is possible, in the standby mode, to cut a current which flows from NMOS transistors 51 and 52 through the short-circuited portion of the defective memory cell (i.e., from NMOS transistors 51 and 52 through the short-circuited portion between the bit line and the word line) to the word line at the ground potential. When the SRAM is in the active mode, load control circuit 49 applies load control signal CSA at H-level to NMOS transistors 51 and 52. This is because that chip select signal /CS is at L-level in the active mode. Owing to this, the potential on bit line goes to (Vcc-Vth) in the active mode.

According to the SRAM of the embodiment 1, as described above, NMOS transistors 51 and 52 are off in the standby mode. In the case where the defective memory cell is replaced with the redundant circuit, therefore, it is possible to reduce an unnecessary current flowing in the standby mode.

(Embodiment 2)

The whole structure of the SRAM according to the embodiment 2 is similar to that of the SRAM in FIG. 2. The SRAM of the embodiment 2 receives chip select signal /CS, read/write control signal RWC and address signals $A_0$-$A_{n-1}$ from CPU 1.

Figure 10:
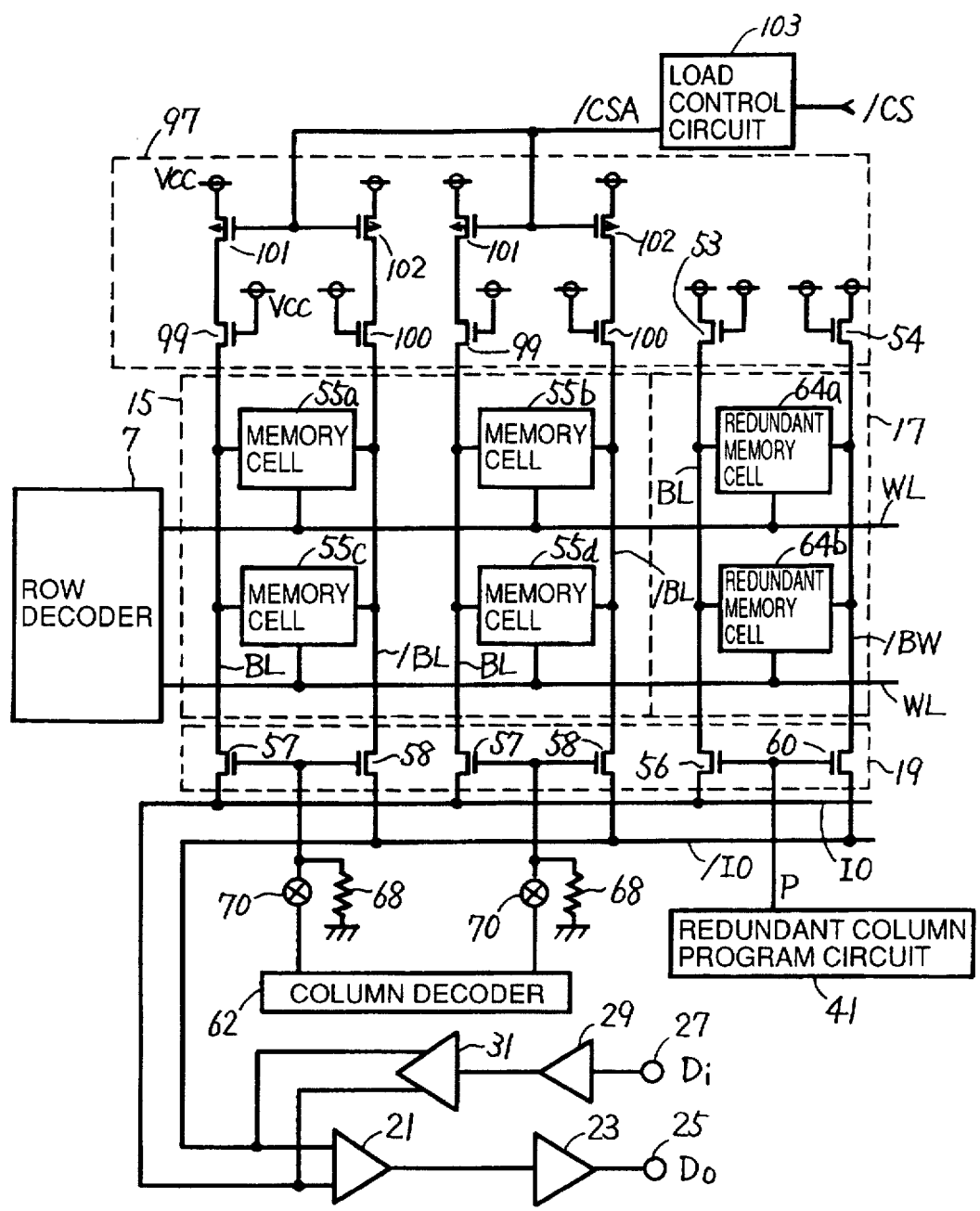
FIG. 10 is a schematic block diagram showing a memory cell array and its peripheral circuitry in an SRAM according to an embodiment 2 of the invention.

FIG. 10 is a schematic block diagram showing a memory cell array and its predetermined circuitry in the SRAM according to the embodiment 2. Portions similar to those in FIGS. 2 and 3 bear the same reference numbers, and will not be described below. Referring to FIG. 10, a bit line load group 97 includes PMOS transistors 101 and 102 as well as NMOS transistors 99, 100, 53 and 54. PMOS transistor 101 and NMOS transistor 99 are connected in series between a node having power supply potential Vcc and bit line BL. A gate of NMOS transistor 99 is connected to the node having power supply potential Vcc. PMOS transistor 102 and NMOS 100 are connected in series between a node having a power supply potential Vcc and bit line /BL. A gate of NMOS transistor 100 is connected to a node having power supply potential Vcc. Load control signal /CSA is applied to gates of PMOS transistors 101 and 102 from load control circuit 103.

Figure 11:
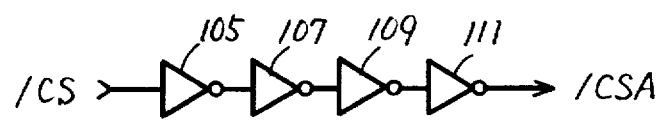
FIG. 11 is a circuit diagram specifically showing a load control circuit in FIG. 10.

FIG. 11 is a circuit diagram specifically showing load control circuit 103 in FIG. 10. Referring to FIG. 11, the load control circuit includes inverters 105, 107, 109 and 111. Inverter 105 is supplied with chip select signal /CS. Inverter 111 issues load control signal /CSA.

Referring to FIGS. 10 and 11, when the SRAM is in the standby mode, load control circuit 103 applies load control signal /CSA at H-level to gates of PMOS transistors 101 and 102. This is because chip select signal /CS is at H-level in the standby mode. Thereby, it is possible, in the standby mode, to cut a current which tends to flow from the node having power supply potential Vcc to the word line at the ground potential through NMOS transistors 99 and 100 and a short-circuited portion in a defective memory cell (i.e., from the node having power supply potential Vcc through NMOS transistors 99 and 100 and a short-circuited portion between the bit line and the word line). When the SRAM is in the active mode, load control circuit 103 applies load control signal /CSA at L-level to gates of PMOS transistors 101 and 102, because chip select signal /CS is at L-level in the active mode. Thereby, the potential on bit line goes to (Vcc-Vth) in the active mode, where Vth represents the threshold voltage of NMOS transistors 99 and 100.

Read, write and replacement of a defective column with the redundant memory cell are performed in manners similar to those of the SRAM according to the embodiment 1.

In the SRAM of the embodiment 2, as described above, PMOS transistors 101 and 102 are off in the standby mode. Therefore, it is possible, in the standby mode, to reduce an unnecessary current flowing in the structure including a defective memory cell replaced with the redundant circuit.

(Embodiment 3)

The SRAM of the embodiment 1 may suffer from the following disadvantage. In the SRAM of the embodiment 1 shown in FIG. 3, the potentials on bit lines BL and /BL lower from (Vcc-Vth) in order to turn off NMOS transistors 51 and 52 in the standby mode. In the SRAM having an increased operation speed, therefore, word line WL is selected before bit lines BL and /BL are sufficiently precharged to (Vcc-Vth), when the mode is switched from the standby mode to the active mode. If the potentials on bit lines BL and /BL are near L-level, a state similar to that in the write operation is set, so that data may be erroneously written into the selected memory cell. The SRAM of the embodiment 3 is developed for overcoming the above problem.

The whole structure of the SRAM of the embodiment 3 is similar to that of the SRAM in FIG. 2. The SRAM of the embodiment 3 receives chip select signal /CS, read/write control signal RWC and address signals $A_0$-$A_{n-1}$ from CPU 1 as shown in FIG. 1.

Figure 12:
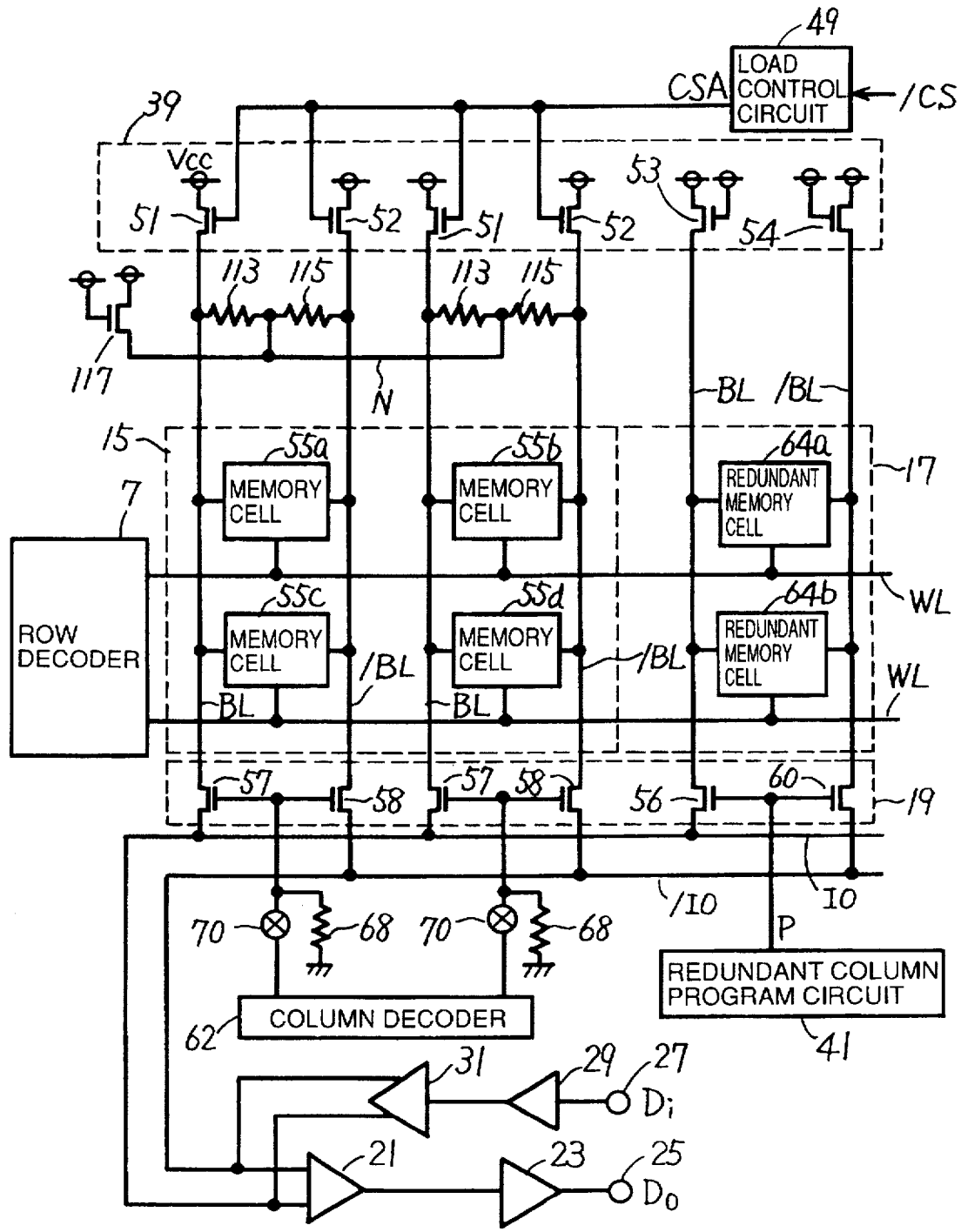
FIG. 12 is a schematic block diagram showing a memory cell array and its peripheral circuitry in an SRAM according to an embodiment 3 of the invention.

FIG. 12 is a schematic block diagram showing a memory cell array and its peripheral circuitry in the SRAM of the embodiment 3. Portions similar to those in FIG. 3 bear the same reference numbers, and will not be described below. Referring to FIG. 12, an NMOS transistor 117 is connected between a node having power supply potential Vcc and a node N. A gate of NMOS transistor 117 is connected to a node having the power supply potential. A resistance element 113 is connected between bit line BL and node N. A resistance element 115 is connected between bit line /BL and node N. Resistance elements 113 and 115 have high resistances, and are formed from the same interconnection layer as resistance elements 59 and 66 in FIG. 4.

In the standby mode, load control circuit 49 applies load control signal CSA at L-level to NMOS transistors 51 and 52, so that NMOS transistors 51 and 52 are off. In this case, bit lines BL and /BL attain a high impedance in the structure of the embodiment 1 shown in FIG. 3. In the embodiment 3 shown in FIG. 12, bit lines BL and /BL are connected to node N having a potential of (Vcc-Vth) via resistance elements 113 and 115. Therefore, the potentials on bit lines BL and /BL are maintained at (Vcc-Vth). Thus, provision of resistance elements 113 and 115 prevent bit lines BL and /BL from attaining the high impedance in the standby mode. In the above (Vcc-Vth), Vth represents a threshold voltage of NMOS transistor 117.

In the SRAM of the embodiment 3, as described above, resistance elements 113 and 115 are arranged between bit lines BL and /BL and node N having a potential of (Vcc-Vth). Therefore, even when word line WL is selected and the memory cell is operated immediately after change from the standby mode to the active mode, erroneous writing of data into the memory cell can be prevented, because the potentials on bit lines BL and /BL are maintained at (Vcc-Vth). Further, in the SRAM according to the embodiment 3, NMOS transistors 51 and 52 are off in the standby mode, similarly to the SRAM of the embodiment 1. Therefore, it is possible to achieve an effect similar to that of the SRAM of the embodiment 1.

(Embodiment 4)

The SRAM of the embodiment 2 may suffer from a disadvantage similar to that of the SRAM of the embodiment 1. As already discussed at the outset in the description of the embodiment 3, such an error may occur in the SRAM of the embodiment 2 that erroneous data may be written into the memory cell when the mode changes from the standby mode to the active mode. The SRAM according to the embodiment 4 is developed to overcome the above problem.

The whole structure of the SRAM according to the embodiment 4 is similar to that of the SRAM in FIG. 2. The SRAM of the embodiment 4 receives chip select signal /CSA, read/write control signal RWC and address signals $A_0$-$A_{n-1}$ from CPU 1 as shown in FIG. 1.

Figure 13:
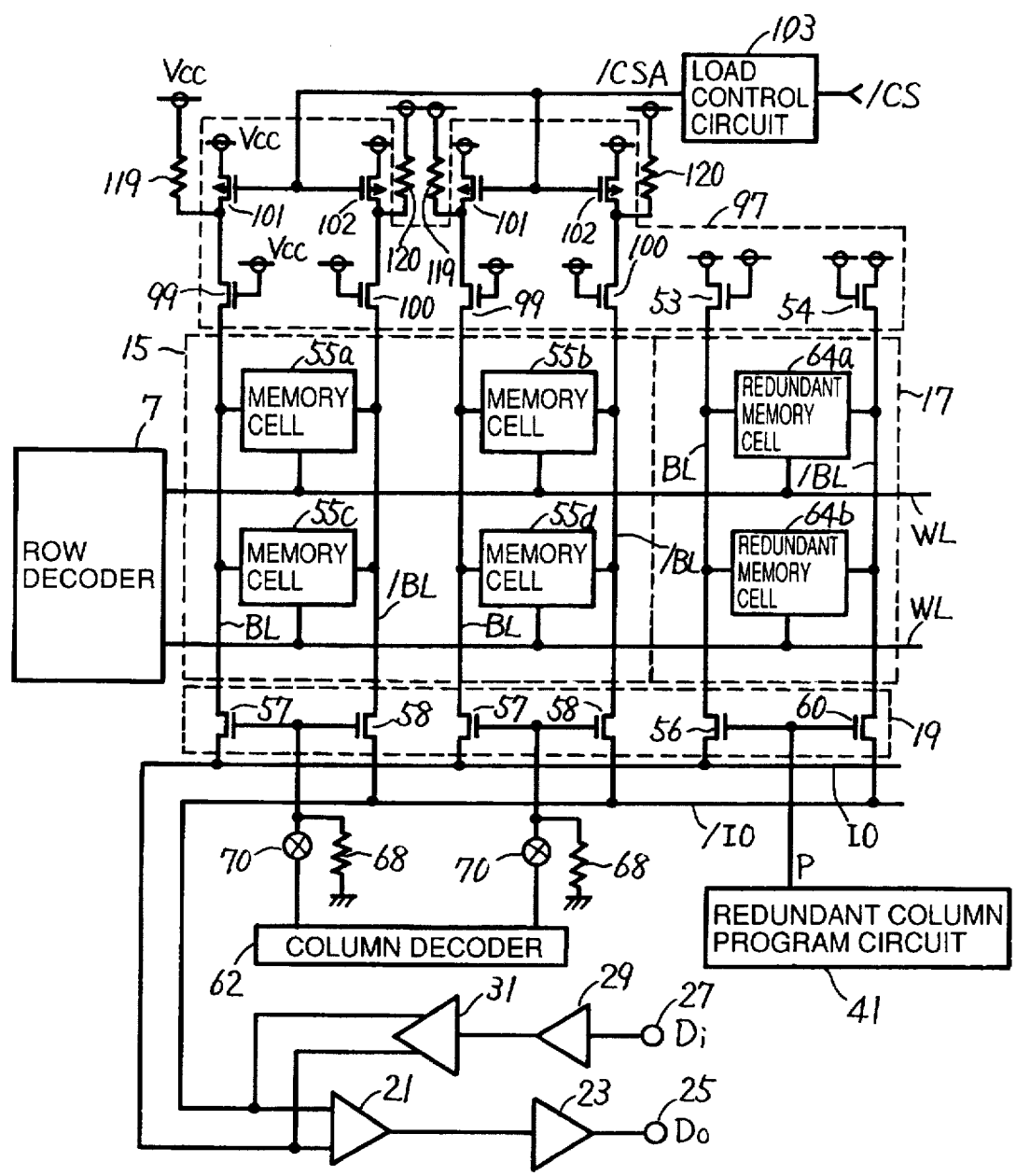
FIG. 13 is a schematic block diagram showing a memory cell array and its peripheral circuitry in an SRAM according to an embodiment 4 of the invention.

FIG. 13 is a schematic block diagram showing a memory cell array and its peripheral circuitry in the SRAM according to the embodiment 4. Portions similar to those flows from NMOS transistors 51 and 52 through the short-circuited in FIGS. 2 and 10 bear the same reference numbers, and will not be described below. Referring to FIG. 13, resistance element 119 is arranged between a drain of PMOS transistor 101 and a node having power supply potential Vcc. Resistance element 120 is arranged between a node having power supply potential Vcc and a drain of PMOS transistor 102. In this embodiment, resistance elements 119 and 120 have high resistances, and are formed from the same interconnection layer as resistance elements 59 and 66 in FIG. 4. In the standby mode, load control circuit 103 applies load control signal /CSA at H-level to PMOS transistors 101 and 102, so that PMOS transistors 101 and 102 are off. In this case, bit lines BL and /BL in FIG. 10 (embodiment 2) attain high impedances. In FIG. 13 (embodiment 4), however, drains of PMOS transistors 101 and 102 are connected to a node having power supply potential Vcc via resistance elements 119 and 120. In the standby mode, therefore, the potentials on bit lines BL and /BL are maintained at (Vcc-Vth). Thus, by connecting resistance elements 119 and 120 to the drains of PMOS transistors 101 and 102, bit lines BL and /BL are prevented from attaining the high impedance in the standby mode.

In the SRAM according to the embodiment 4, as described above, drains of PMOS transistors 101 and 102 are connected to the node having power supply potential Vcc via resistance elements 119 and 120. Therefore, even when the word line is selected to operate the memory cell immediately after change from the standby mode to the active mode, the potential on bit line is maintained at (Vcc-Vth), so that erroneous writing of data into the memory cell can be prevented. In the SRAM according to the embodiment 4, PMOS transistors 101 and 102 are off in the standby mode, as is done in the SRAM of the embodiment 2. Therefore, it achieves an effect similar to that of the SRAM of the embodiment 2.

(Embodiment 5)

Figure 14:
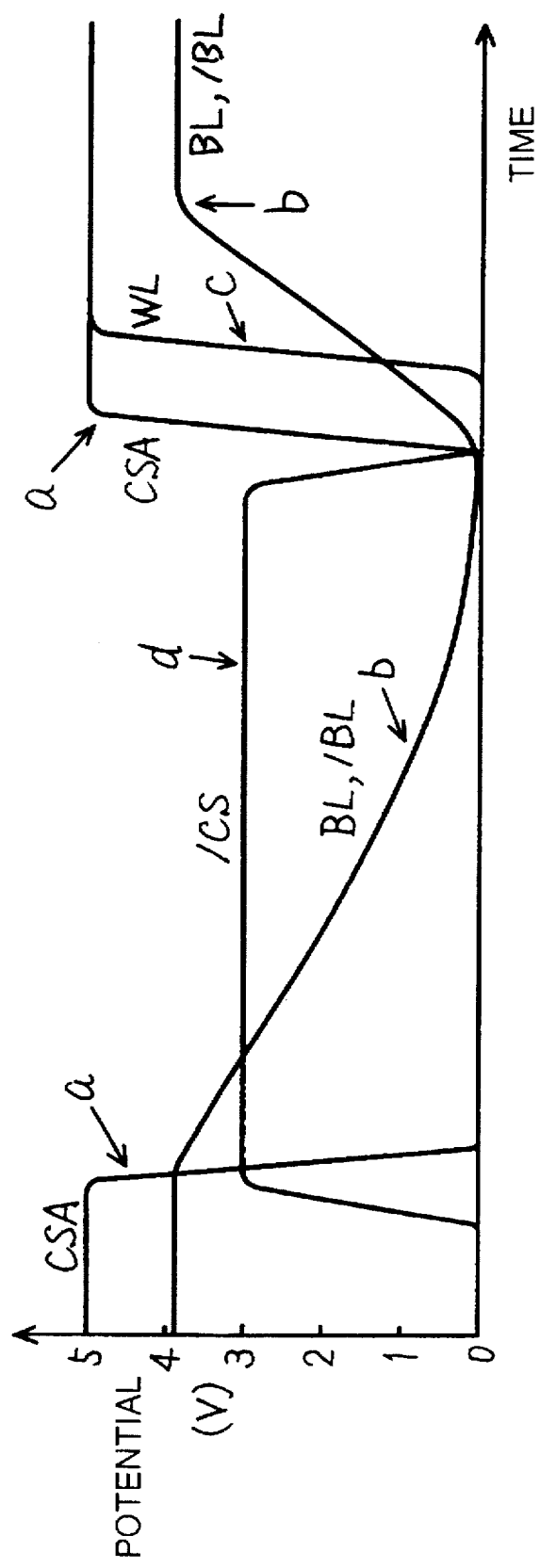
FIG. 14 shows a problem of the SRAM according to the embodiment 1 of the invention.

FIG. 14 is a timing chart showing a problem of the SRAM according to the embodiment 1. In FIG. 14, the abscissa gives the time, and the ordinate gives the potential. Referring to FIGS. 13 and 14, a curve indicated by an arrow a in FIG. 14 represents load control signal CAS, and a curve indicated by an arrow b in FIG. 14 represents the potentials on bit lines BL and /BL. A curve indicated by an arrow c in FIG. 14 represents the potential on word line WL, and a curve indicated by an arrows d in FIG. 14 represents chip select signal /CS.

In the SRAM according to the embodiment 1, the potentials on bit lines BL and /BL are maintained at (Vcc-Vth) in the active mode, but, in the standby mode, a leak current flows to a semiconductor substrate (not shown) from portions connecting bit lines BL and /BL to memory cells 55a-55d in the standby mode. Therefore, potentials on bit lines BL and /BL lower from (Vcc-Vth) to L-level. When the standby mode is then shifted to the active mode, the potentials on bit lines BL and /BL are precharged to (Vcc-Vth) by NMOS transistors 51 and 52 of bit line load group 39. However, in the SRAM having an increased operation speed, word line WL is selected before bit lines BL and /BL are precharged to (Vcc-Vth). In this case, if the potentials on bit lines BL and /BL are near L-level, a state similar to that in the write operation is attained, so that data may be erroneously written into the memory cell. The SRAM of the embodiment 5 is developed to overcome the this problem.

The whole structure of the SRAM according to the embodiment 5 is similar to that of the SRAM in FIG. 2. The SRAM of the embodiment 5 receives chip select signal /CS, read/write control signal RWC and address signals $A_0$-$A_{n-1}$ from CPU 1 as shown in FIG. 1.

Figure 15:
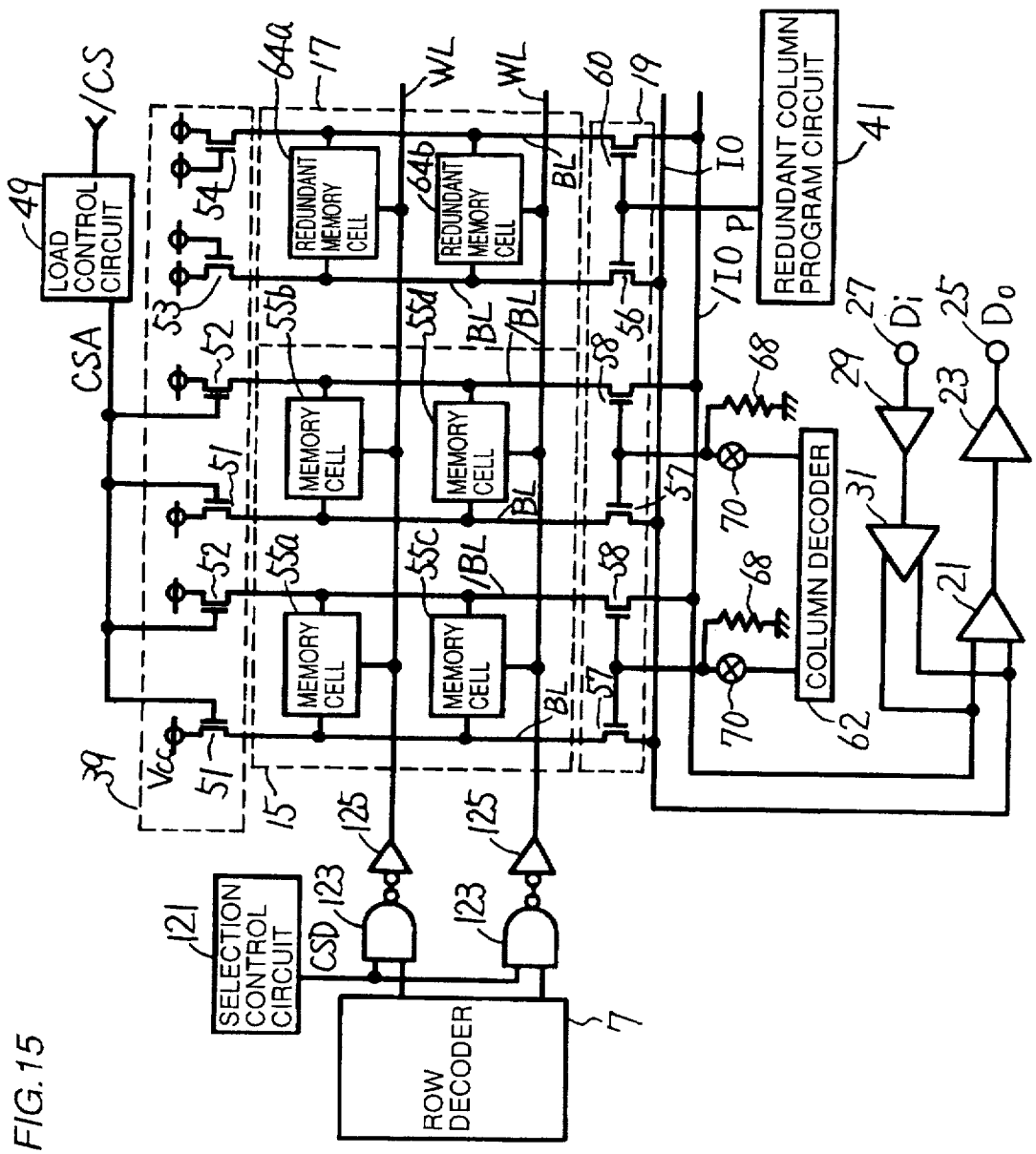
FIG. 15 is a schematic block diagram showing a memory cell array and its peripheral circuitry in an SRAM according to an embodiment 5 of the invention.

FIG. 15 is a schematic block diagram showing a memory cell array and its peripheral circuitry in the SRAM according to the embodiment 5. Portions similar to those in FIG. 3 bear the same reference numbers, and will not be described below. Referring to FIG. 15, an NAND circuit 123 and an inverter 125 are arranged between word line WL and row address decoder 7. The SRAM is also provided with a selection control circuit 121, from which a selection control signal CSD is supplied from selection control circuit 121 to one of input nodes of NAND circuit 123. NAND circuit 123 is supplied on the other input node with an output of row address decoder 7. An output node of NAND circuit 123 is connected to an input node of inverter 125. An output node of inverter 125 is connected to word line WL.

Figure 16:
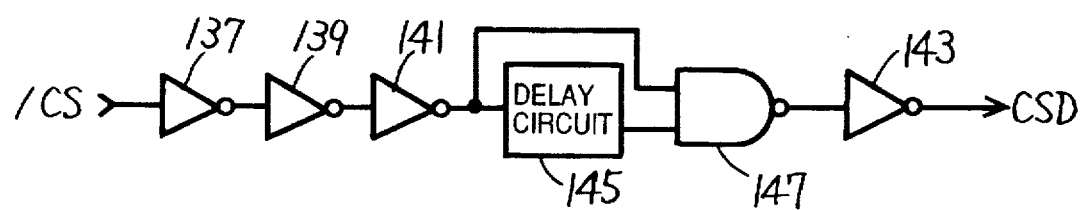
FIG. 16 is a circuit diagram specifically showing a select control circuit in FIG. 15.

FIG. 16 is a circuit diagram specifically showing selection control circuit 121 in FIG. 15. Referring to FIG. 16, the selection control circuit includes inverters 137, 139, 141 and 143, a delay circuit 145 and an NAND circuit 147. Inverters 137, 139 and 141 are connected in series. Inverter 137 receives chip select signal /CS. An output node of inverter 141 is connected to a delay circuit 145 and one of input nodes of NAND circuit 147. An output node of delay circuit 145 is connected to the other input node of NAND circuit 147. The output node of NAND circuit 147 is connected to an input node of inverter 143. Inverter 143 issues selection control signal CSD.

Figure 17:
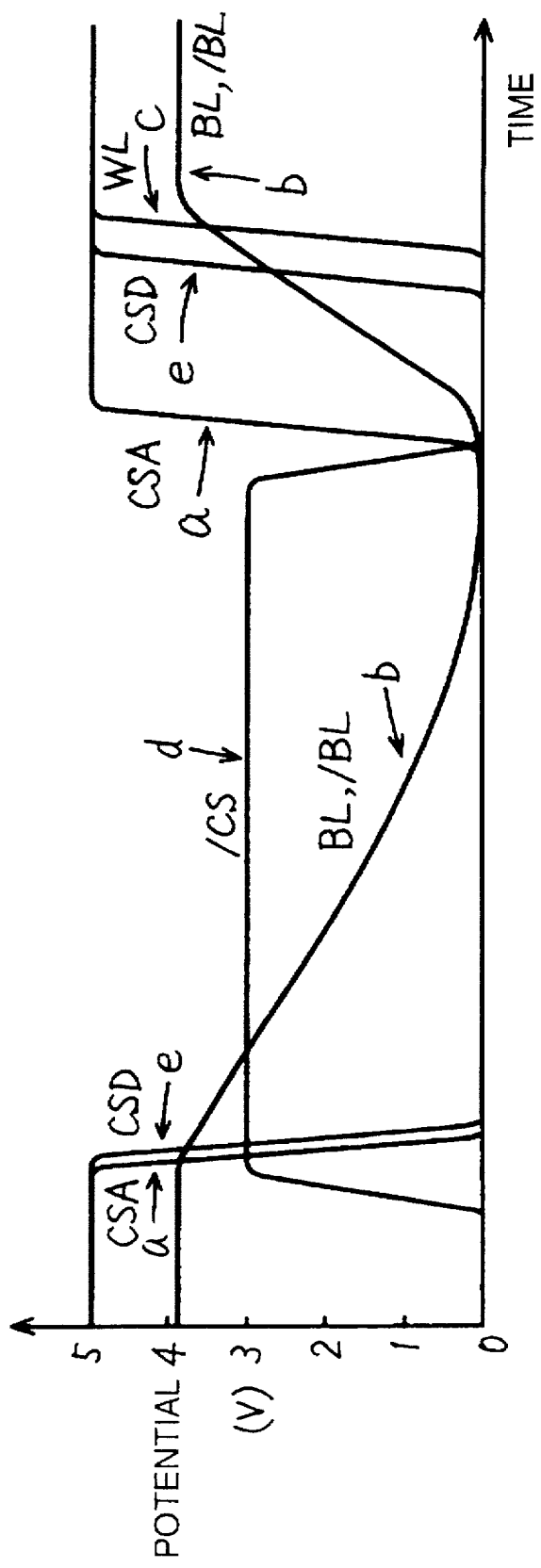
FIG. 17 is a timing diagram showing an operation of the SRAM according to the embodiment 5 of the invention.

FIG. 17 is a timing chart showing an operation of the SRAM according to the embodiment 5. Referring to FIGS. 15 and 17, a curve indicated by an arrow a in FIG. 17 represents load control signal CSA, and a curve indicated by an arrow b in FIG. 17 represents potentials on bit lines BL and /BL. A curve indicated by an arrow c in FIG. 17 represents the potential on word line WL, a curve indicated by an arrow d in FIG. 17 represents chip select signal /CS, and a curve indicated by an arrow e in FIG. 17 represents selection control signal CSD. The abscissa given the time, and the ordinate gives the potential.

Referring to FIGS. 15, 16 and 17, when the mode changes from the standby mode to the active mode, load control signal CSA changes from L-level to H-level. Thereby, NMOS transistors 51 and 52 of bit line load group 39 are turned on to start precharging of bit lines BL and /BL. When the standby mode changes to the active mode, selection control signal CSD does not attain H-level, until the potentials on bit lines BL and /BL changes from L-level to the level near or above (Vcc-Vth). Thus, selection control signal CSD attains H-level after bit lines BL and /BL attains the potential near or above (Vcc-Vth). Therefore, word line WL will not be selected before the potentials on bit lines BL and /BL changes from L-level to the level near or above (Vcc-Vth). Thus, word line WL does not attain H-level before the potentials on bit lines BL and /BL reach or exceed the proximity of (Vcc-Vth), even in the case where the output of row address decoder 7 attains H-level. Therefore, erroneous writing of data into the memory cell can be prevented when the standby mode changes into the active mode. A delay time of delay circuit 145 is set to prevent such a situation that selection control signal CSD attains H-level before the potentials on bit lines BL and /BL reach or exceed the proximity of (Vcc-Vth) in the case where the standby mode changes into the active mode. The "proximity of (Vcc-Vth)" means the potential of about 80% of (Vcc-Vth).

According to the SRAM of the embodiment 5, as described above, word line WL is not selected before the potentials on bit lines BL and /BL reach the proximity of (Vcc-Vth). Thereby, it is possible to prevent erroneous writing of data into the memory cell when the standby mode changes into the active mode. Further, in the SRAM of the embodiment 5, NMOS transistors 51 and 52 of bit line load group 39 are off in the standby mode, similarly to the SRAM of the embodiment 1. Therefore, an effect similar to that of the SRAM of the embodiment 1 can be achieved.

(Embodiment 6)

The whole structure of the SRAM according to the embodiment 6 is similar to that of the SRAM in FIG. 2. The SRAM of the embodiment 6 receives chip select signal /CS, read/write control signal RWC and address signals $A_0$-$A_{n-1}$ from CPU 1 as shown in FIG. 1.

Figure 18:
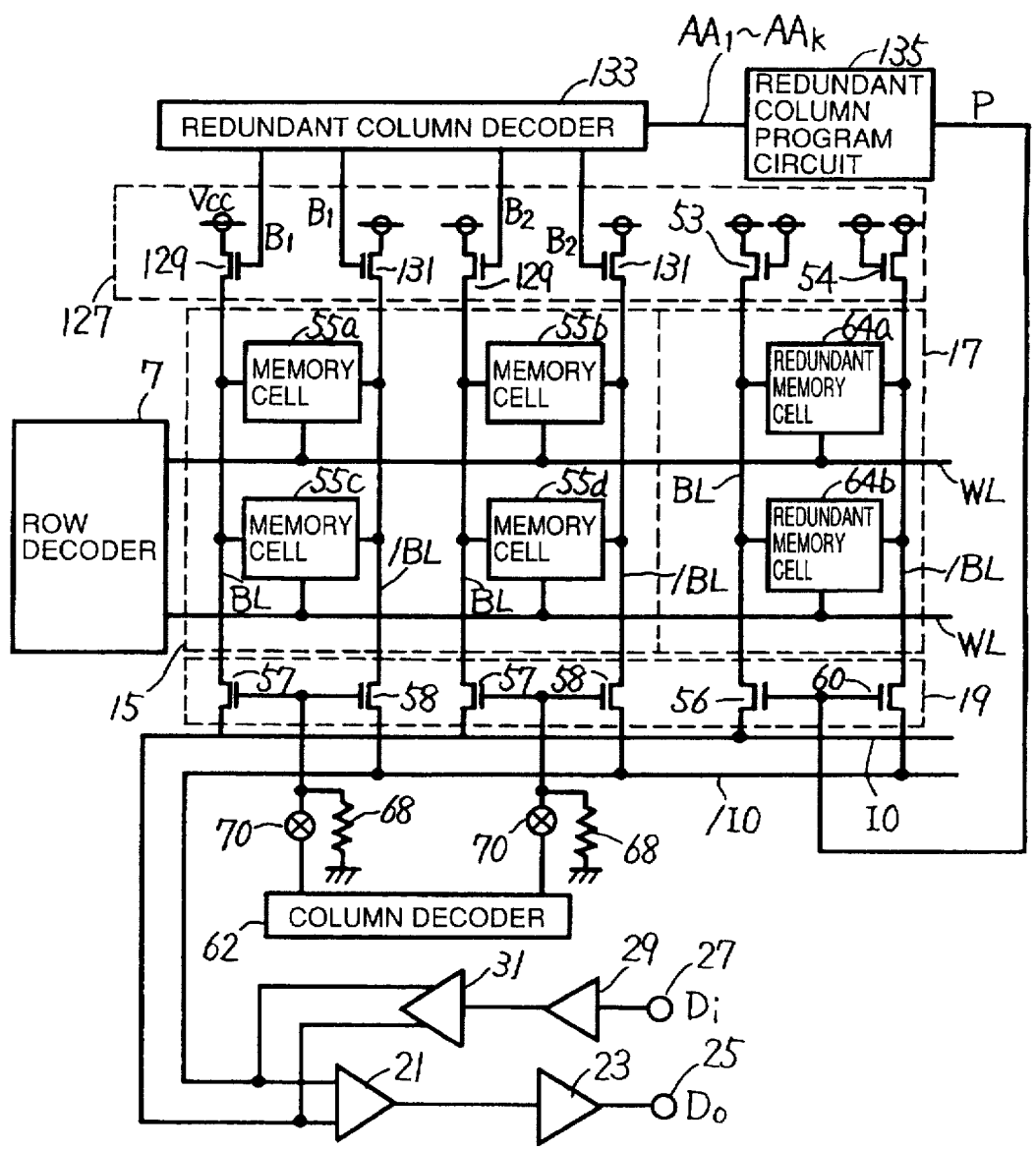
FIG. 18 is a schematic block diagram showing a memory cell array and its peripheral circuitry in an SRAM according to an embodiment 6 of the invention.

FIG. 18 is a schematic block diagram showing a memory cell array and its peripheral circuitry in the SRAM according to the embodiment 6. Portions similar to those in FIG. 3 bear the same reference numbers, and will not be described below. At a peripheral circuitry of memory cell 15 shown in FIG. 18, there are arranged a redundant column decoder 133, a redundant column program circuit 135, a bit line load group 127, row address decoder 7, redundant memory cell column 17, multiplexer 19, fuses 70, resistance elements 68, column address decoder 62, sense amplifier 21, output data buffer 23, data output terminal 25, data input terminal 27, input data buffer 29 and write data buffer 31. Column address data $AA_1$-/$AA_k$ issued from redundant column program circuit 135 are applied to redundant column decoder 133. Output signals B1 and B2 of redundant column decoder 133 are applied to gates of NMOS transistors 129 and 131 of bit line load group 127. Signal P issued from redundant column program circuit 135 is applied to gates of NMOS transistors 56 and 60 of multiplexer 19. Signal P functions similarly to signal P in FIG. 3. NMOS transistor 129 is arranged between a node having power supply potential Vcc and bit line BL of memory cell array 15. NMOS transistor 131 is arranged between a node having power supply potential Vcc and bit line /BL of memory cell array 15.

Redundant column decoder 133 and redundant column program circuit 135 will be briefly described below. Redundant column program circuit 135 is programmed with column addresses representing defective columns to be replaced with redundant memory cell columns 17. Redundant column program circuit 135 supplies column address data $AA_1$-/$AA_k$ according to the programmed column addresses to redundant column decoder 133. Redundant column decoder 133 operates in accordance with column address data $AA_1$-/$AA_k$ to set only bit lines BL and /BL in the defective column to be replaced to the high impedance without setting the other bit lines BL and /BL to the high impedance. Thus, redundant column decoder 133 applies a signal at L-level to gates of NMOS transistors 129 and 131 corresponding to the column to be replaced, and applies a signal at H-level to gates of NMOS transistors 129 and 131 corresponding to the other columns.

Figure 19:
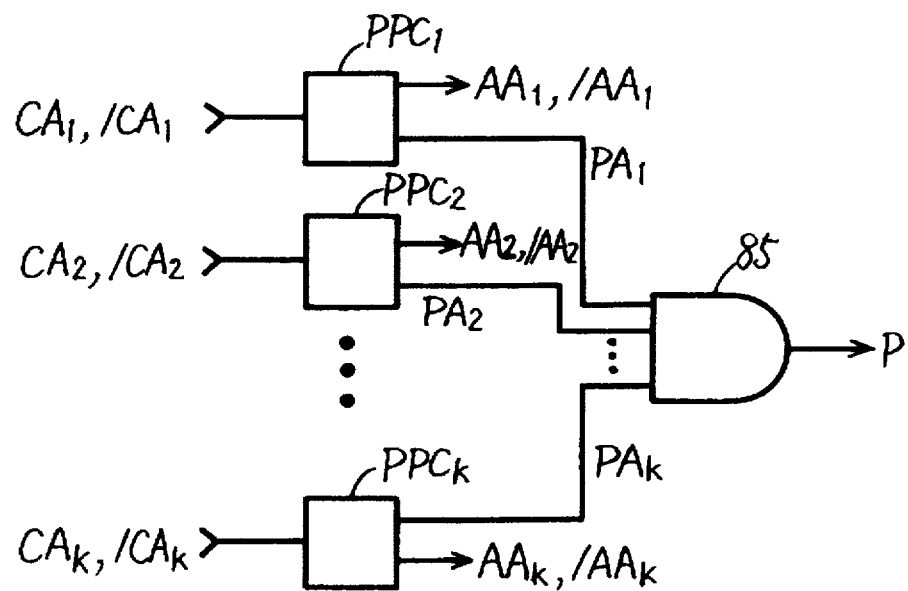
FIG. 19 is a schematic block diagram showing redundant column program circuits in FIG. 18.

FIG. 19 is a schematic block diagram showing redundant column program circuit 135 shown in FIG. 18. Portions similar to those in FIG. 7 bear the same reference numbers, and will not be described below. Referring to FIG. 19, the redundant column program circuit includes program circuits $PPC_1$-$PPC_k$ and AND circuit 85. Program circuits $PPC_1$-$PPC_k$ receive corresponding column address signals $CA_1$-$CA_k$ among address signals $A_0$-$A_{n-1}$, respectively. Program circuits $PPC_1$-$PPC_k$ receive signals /$CA_1$-/$CA_k$ produced by inverting the corresponding column address signals $CA_1$-$CA_k$, respectively. Program circuits $PPC_1$-$PPC_k$ issue signals $AA_1$-$AA_k$ and their inverted signals /$AA_1$-/$AA_k$, respectively. AND circuit 85 is supplied with signals $PA_1$-$PA_k$. AND circuit 85 issues signal P. The number of program circuits $PPC_1$-$PPC_k$ depends on the number of columns in the memory cell array.

Figure 20:
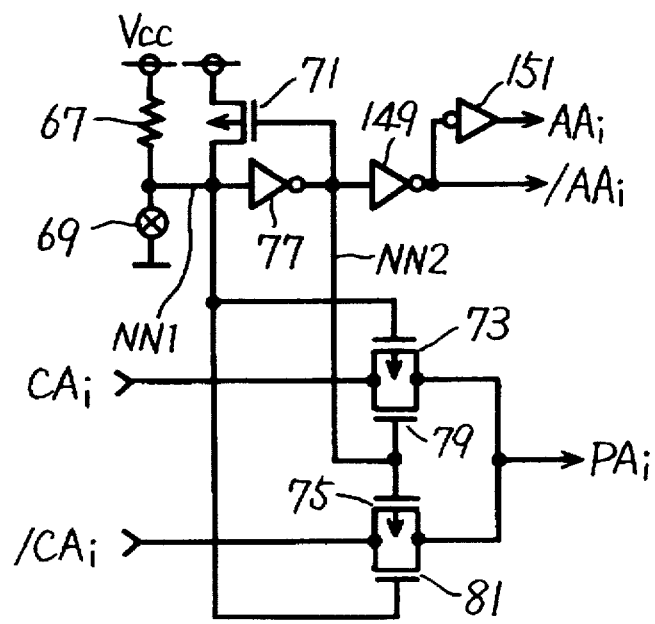
FIG. 20 is a circuit diagram specifically showing one of program circuits $PPC_1$-$PPC_k$ in FIG. 19.

FIG. 20 is a circuit diagram specifically showing program circuits $PPC_1$-$PPC_k$ in FIG. 19. Portions similar to those in FIG. 8 bear the same reference numbers, and will not be described below. Referring to FIG. 20, the program circuit includes resistance element 67, fuse 69, PMOS transistors 71, 73 and 75, NMOS transistors 79 and 81, and inverters 77, 149 and 151. An input node of inverter 149 is connected to node NN2. Inverter 149 issues signal /$AA_i$. An output node of inverter 149 is connected to an input node of inverter 151. Inverter 151 issues signal $AA_i$. Signal $AA_i$ represents any one of signals $AA_1$-$AA_k$, and signal /$AA_i$ represents any one of signals /$AA_1$-/$AA_k$. Signals $AA_1$-/$AA_k$ form column address data.

Figure 21:
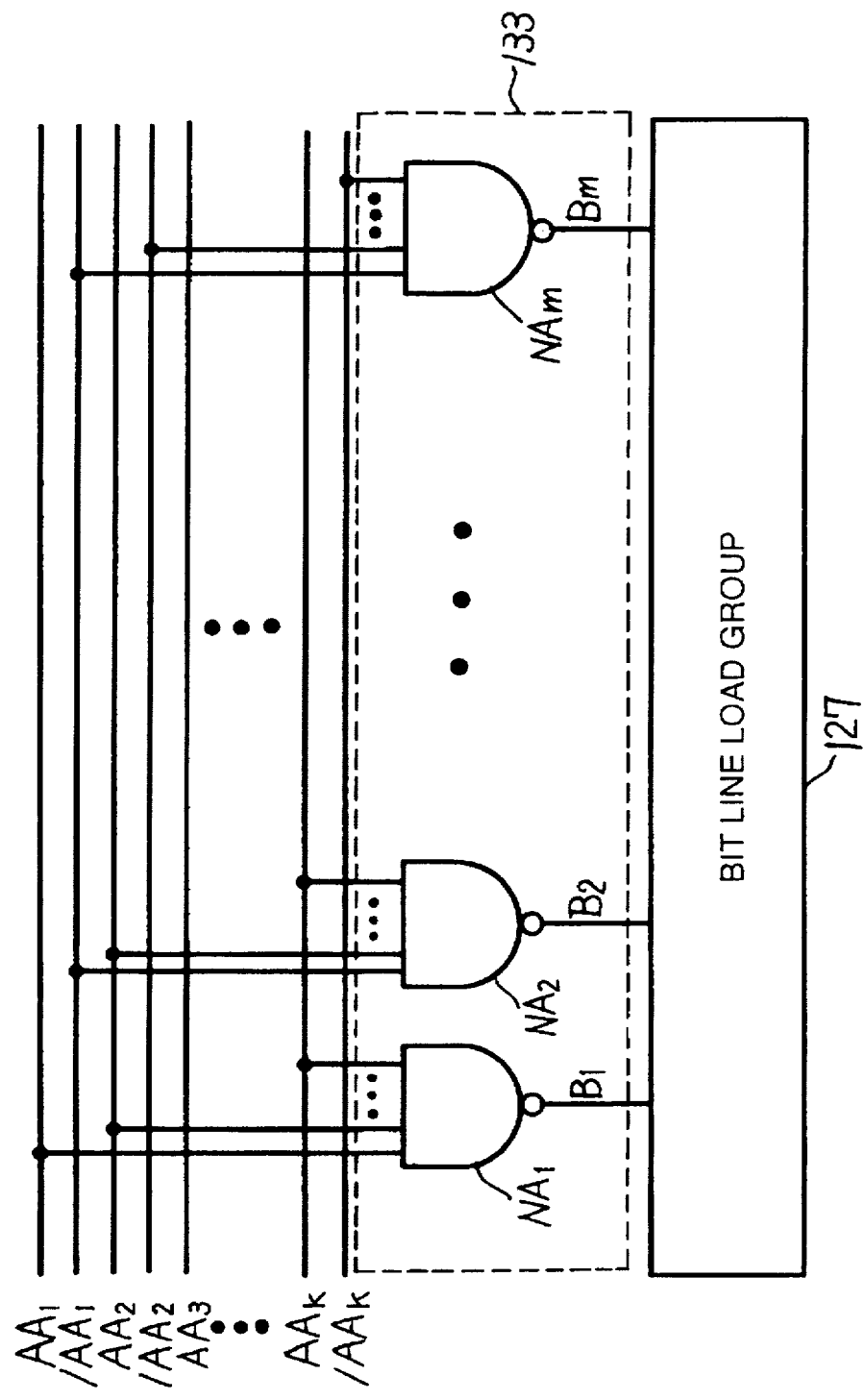
FIG. 21 is a circuit diagram specifically showing a redundant column decoder in FIG. 19.

FIG. 21 is a circuit diagram specifically showing redundant column decoder 133 in FIG. 18. Portions similar to those in FIG. 18 bear the same reference numbers, and will not be described below. Referring to FIG. 21, redundant column decoder 133 includes NAND circuits $NA_1$-$NA_m$. NAND circuits $NA_1$-$NA_m$ are supplied with predetermined combinations of signals $AA_1$-/$AA_k$. For example, NAND circuit $NA_1$ is supplied with signals $AA_1$, $AA_2$, ..., $AA_k$. Output signals $B_1$-$B_m$ of NAND circuits $NA_1$-$NA_m$ are supplied to gates of NMOS transistors 129 and 131 (FIG. 18) in the corresponding column. Here, FIG. 21 shows a structure of redundant column decoder 133 in the case where the SRAM in FIG. 18 has columns more than two.

Referring to FIGS. 18, 19, 20 and 21, operations of redundant column decoder 133 and redundant column program circuit 135 will be described below. In the following description, it is assumed that the column corresponding to memory cells 55a and 55c is replaced with redundant memory cell column 17. Thus, it is assumed that the column corresponding to memory cells 55a and 55c is defective. It is also assumed that the column corresponding to memory cells 55a and 55c is selected when all row address signals $CA_1$-$CA_k$ are at H-level. In this case, any of fuses 69 of program circuits $PPC_1$-$PPC_k$ is not blown. This fixes all signals $AA_1$-$AA_k$ at H-level, and fixes all signals /$AA_1$-/$AA_k$ at L-level. This means that the column address representing the defective column to be replaced with redundant memory cell column 17 is programmed in the redundant column program circuit 135. Therefore, only output signal B1 of NAND circuit $NA_1$ receiving signals $AA_1$-$AA_k$ at H-level attains H-level. NAND circuits $NA_2$-$NA_m$ each are at least supplied with one of signals /$AA_1$-/$AA_k$, so that all output signals $B_2$-$B_m$ of NAND circuits $NA_2$-$NA_m$ attain L-level. From the foregoing, signal B1 at L-level is supplied only to gates of NMOS transistors 129 and 131 corresponding to the defective column, and signals $B_2$-$B_m$ at H-level are supplied to gates of NMOS transistors 129 and 131 corresponding to the columns other than the defective column. Therefore, only NMOS transistors 129 and 131 corresponding to the defective column are off, and NMOS transistors 129 and 131 corresponding to columns other than the defective column are on.

According to the SRAM of embodiment 6, as described above, NMOS transistors 129 and 131 corresponding to the defective column to be replaced with redundant memory cell column 17 are turned off. Therefore, it is possible to cut off a current, which tends to flow from the power supply for power supply potential Vcc to the word line at the ground potential through NMOS transistors 129 and 131 corresponding to the defective column and a short-circuited portion of the defective memory cell (NMOS transistors 129 and 131 corresponding to the defective column, and the short-circuited portion between the bit line in the defective column and the word line).

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having an active mode wherein said device is selected by a chip select signal, and a standby mode wherein said deice is not selected by a chip select signal, comprising:

a plurality of memory cells arranged in a matrix form of rows and columns;

a plurality of bit line pairs arranged corresponding to said columns and each being connected to the memory cells in the corresponding column;

a plurality of word lines arranged corresponding to said rows and each being connected to said memory cells in the corresponding row;

a plurality of load means each being provided between each bit line of each of said plurality of bit line pairs and a node having a first potential for setting a potential on the corresponding bit line to a predetermined potential, each load means having a first impedance;

load control means for setting, in the active mode, the impedance of each of said plurality of load means to said first impedance, and setting, in the standby mode, the impedance of each of said plurality of load means to a second impedance larger than said first impedance;

a column of redundant memory cells provided for replacing a column of memory cells having a defective memory cell; and means for replacing said column of memory cells having a defective memory cell with said column of redundant memory cells, when an applied column address signal selects said column of memory cells having a defective memory cell, wherein all of said word lines are unselected in the standby mode.

2. The semiconductor memory device according to claim 1, wherein each of said load means is a transistor, and said load control means turns on said transistor in the active mode, and turns off said transistor in the standby mode.

3. The semiconductor memory device according to claim 1, further comprising a plurality of high resistance means provided between each of said bit lines and a node having a second potential, respectively.

4. The semiconductor memory device according to claim 1, wherein each of said load means includes:

a transistor of a first conductivity type provided between a node having said first potential and a corresponding intermediate node, and a transistor of a second conductivity type provided between the corresponding intermediate node and the corresponding bit line;

said load control means turns on each of said transistors of the first conductivity type in the active mode, and turns off each of said transistors of the first conductivity type in the standby mode; and each of said transistors of the first conductivity type supplies said first potential to the corresponding intermediate node, and, on the basis of said supplied first potential, each of said transistors of the second conductivity type sets the corresponding bit line to said predetermined potential.

5. A semiconductor memory device according to claim 4, further comprising:

a plurality of high resistance means each provided between each of said intermediate nodes and a node having a second potential.

6. A semiconductor memory device according to claim 1, further comprising:

selection control means for preventing setting of any one of said word lines to the selected state until the potential on each of said bit lines reaches the proximity of said predetermined potential after change from the standby mode to the active mode.

7. A semiconductor memory comprising:

a plurality of memory cells arranged in a matrix form of rows and columns;

a plurality of bit line pairs arranged corresponding to said columns and each being connected to the memory cells in the corresponding column;

a plurality of load means provided between each bit line of each of said plurality of bit line pairs and a node having a first potential for setting a potential on the corresponding bit line to a predetermined potential;

a column of redundant memory cells provided for replacing a column of memory cells having a defective memory cell; and load control means for setting an impedance of the load means corresponding to the bit line connected to said column of memory cells replaced with said column of redundant memory cells to exceed an impedance of the load means corresponding to another bit line.

8. The semiconductor memory device according to claim 7, wherein each of said load means is a transistor, and said load control means turns off said transistor corresponding to said bit line connected to said memory cell replaced with said redundant memory cell, and turns on said transistors corresponding to the other bit lines.

* * * * *